(12) United States Patent
Yoshihara

(10) Patent No.: US 12,040,301 B2
(45) Date of Patent: Jul. 16, 2024

(54) SEMICONDUCTOR DEVICE

(71) Applicant: ROHM CO., LTD., Kyoto (JP)

(72) Inventor: Katsuhiko Yoshihara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 495 days.

(21) Appl. No.: 17/292,878

(22) PCT Filed: Nov. 8, 2019

(86) PCT No.: PCT/JP2019/043872
§ 371 (c)(1),
(2) Date: May 11, 2021

(87) PCT Pub. No.: WO2020/105476
PCT Pub. Date: May 28, 2020

(65) Prior Publication Data
US 2021/0407954 A1    Dec. 30, 2021

(30) Foreign Application Priority Data

Nov. 22, 2018 (JP) .................................. 2018-219438

(51) Int. Cl.
*H01L 23/00* (2006.01)
*H01L 23/495* (2006.01)
(Continued)

(52) U.S. Cl.
CPC ........ *H01L 24/40* (2013.01); *H01L 23/49575* (2013.01); *H01L 23/52* (2013.01);
(Continued)

(58) Field of Classification Search
None
See application file for complete search history.

(56) References Cited

U.S. PATENT DOCUMENTS

2010/0295185 A1* 11/2010 Park ....................... H10B 41/35
  257/E21.585
2014/0203420 A1* 7/2014 Miyasaka ............... H01L 25/18
  219/121.64

(Continued)

FOREIGN PATENT DOCUMENTS

JP    2008-66561 A    3/2008
JP    2009-105267 A   5/2009
(Continued)

OTHER PUBLICATIONS

Office Action issued in corresponding Japanese Patent Application No. 2020-558275, Jan. 31, 2023, 4 pages w/translation.

*Primary Examiner* — Nishath Yasmeen
(74) *Attorney, Agent, or Firm* — HSML P.C.

(57) ABSTRACT

Semiconductor device A1 of the present disclosure includes: semiconductor element 10 (semiconductor elements 10A and 10B) having element obverse face and element reverse face facing toward opposite sides in z direction; support substrate 20 supporting semiconductor element 10; conductive block 60 (first block 61 and second block 62) bonded to element obverse face via first conductive bonding material (block bonding materials 610 and 620); and metal member (lead member 40 and input terminal 32) electrically connected to semiconductor element 10 via conductive block 60. Conductive block 60 has a thermal expansion coefficient smaller than that of metal member. Conductive block 60 and metal member are bonded to each other by a weld portion (weld portions M4 and M2) at which a portion of conductive block 60 and a portion of metal member are welded to each other. Thus, the thermal cycle resistance can be improved.

19 Claims, 23 Drawing Sheets

(51) Int. Cl.
*H01L 23/52* (2006.01)
*H01L 25/07* (2006.01)

(52) U.S. Cl.
CPC ............ *H01L 24/84* (2013.01); *H01L 25/072* (2013.01); *H01L 23/49537* (2013.01); *H01L 23/49582* (2013.01); *H01L 24/73* (2013.01); *H01L 2224/40155* (2013.01); *H01L 2224/40491* (2013.01); *H01L 2224/40499* (2013.01); *H01L 2224/405* (2013.01); *H01L 2224/73221* (2013.01); *H01L 2224/73263* (2013.01); *H01L 2224/84214* (2013.01); *H01L 2924/01402* (2013.01); *H01L 2924/01403* (2013.01); *H01L 2924/40252* (2013.01); *H01L 2924/404* (2013.01)

(56) References Cited

U.S. PATENT DOCUMENTS

| 2015/0048068 | A1* | 2/2015 | Matsushita | H01L 24/40 219/121.64 |
| 2015/0194362 | A1* | 7/2015 | Otremba | H01L 24/18 257/676 |
| 2016/0343590 | A1* | 11/2016 | Yoshihara | H01L 23/49582 |
| 2017/0278762 | A1* | 9/2017 | Kessler | H01L 23/49816 |
| 2017/0323780 | A1* | 11/2017 | Koga | B32B 7/12 |
| 2018/0145007 | A1* | 5/2018 | Hatano | H01L 25/115 |
| 2020/0052449 | A1* | 2/2020 | Takewaki | H01L 21/4825 |

FOREIGN PATENT DOCUMENTS

| JP | 2011-204863 A | | 10/2011 |
| JP | 2015-149326 A | | 8/2015 |
| JP | 2018-148968 | * | 8/2018 |
| WO | 2016/072429 A1 | | 5/2016 |

* cited by examiner

SEMICONDUCTOR DEVICE

TECHNICAL FIELD

The present disclosure relates to a semiconductor device that includes a semiconductor element.

BACKGROUND ART

Patent Document 1 discloses a conventional semiconductor device. The semiconductor device described in Patent Document 1 includes a semiconductor element, an island, a lead, a plurality of bonding materials, a connection plate, and a sealing resin. In this semiconductor device, the semiconductor element is, for example, a transistor such as a MOSFET (Metal-Oxide-Semiconductor Field-Effect Transistor). The semiconductor element has electrodes that are provided on upper and lower faces. The semiconductor element is adhered to the island. A bonding material, such as solder, is used for the adhesion. The electrode on the lower face of the semiconductor element is electrically connected to the island. The connection plate is made of metal such as copper. One end of the connection plate is connected to the electrode on the upper face of the semiconductor element, and the other end is connected to the lead. A bonding material, such as solder, is used to connect the connection plate.

PRIOR ART DOCUMENTS

Patent Document
    Patent Document 1: JP 2011-204863A

SUMMARY OF THE INVENTION

Problem to be Solved by the Invention

Heat is generated from the semiconductor element while the semiconductor device is energized (operating). Due to the heat generation from the semiconductor element, thermal stress is applied to the bonding material that bonds the semiconductor element to the connection plate. In particular, when the semiconductor device is operated with a high voltage and a large current, the amount of heat generated from the semiconductor element increases, and therefore, more thermal stress is applied to the bonding material. One causes of the occurrence of thermal stress is a difference between the thermal expansion coefficient of the semiconductor element and the thermal expansion coefficient of the connection plate. Meanwhile, while the semiconductor device is stopped, the temperature thereof is cooled to the environmental temperature, and the thermal stress applied to the connection plate decreases. Thus, the bonding material is repeatedly subjected to thermal stress due to a thermal cycle that occurs due to repeated operating and stopping of the semiconductor device. As a result, fatigue failure or peeling may occur in the bonding material, which causes a malfunction of the semiconductor device. Therefore, it is desired that the semiconductor device has improved thermal cycle resistance.

The present disclosure has been made in view of the foregoing problem, and aims to provide a semiconductor device with which the thermal cycle resistance is improved.

Means for Solving the Problem

A semiconductor device provided according to a first aspect of the present disclosure includes: a semiconductor element having an element obverse face and an element reverse face facing toward opposite sides in a first direction; a support substrate that supports the semiconductor element; a conductive block bonded to the element obverse face via a first conductive bonding material; and a metal member that is electrically connected to the semiconductor element via the conductive block. The conductive block has a thermal expansion coefficient smaller than a thermal expansion coefficient of the metal member. The conductive block and the metal member are bonded to each other by a weld portion at which a portion of the conductive block and a portion of the metal member are welded to each other.

Advantages of the Invention

According to the semiconductor device of the present disclosure, the thermal cycle resistance can be improved.

MODE FOR CARRYING OUT THE INVENTION

Figure 1:
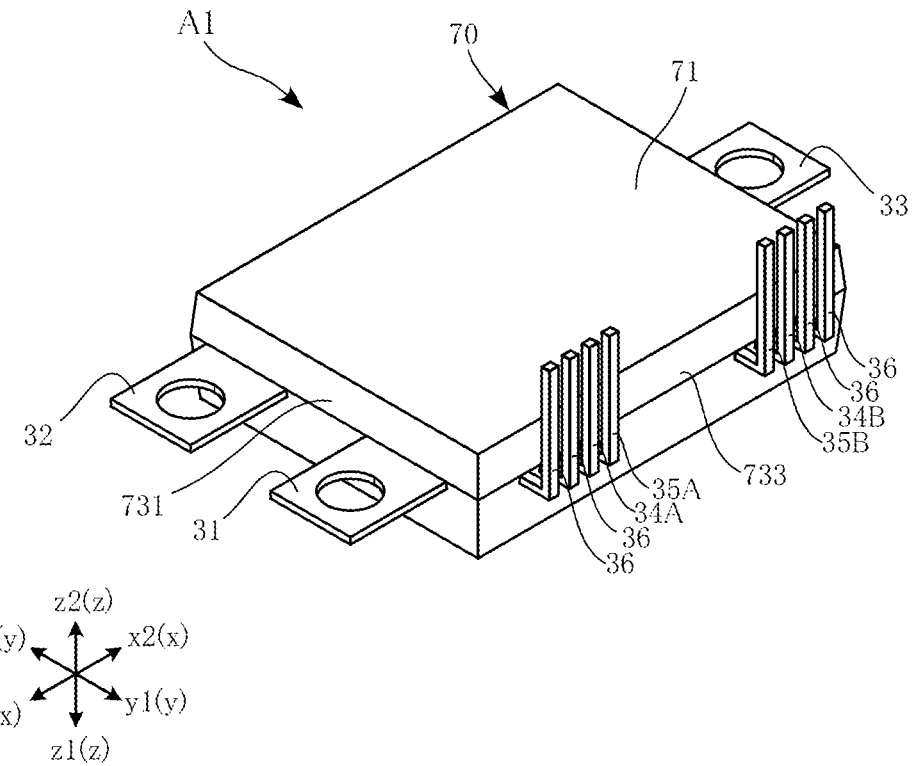
FIG. 1 is a perspective view showing a semiconductor device according to a first embodiment.

Preferred embodiments of the semiconductor device of the present disclosure will be described below with reference to the drawings.

First Embodiment

FIGS. 1 to 12 show a semiconductor device according to the first embodiment. A semiconductor device A1 of the first embodiment includes a plurality of semiconductor elements 10, a support substrate 20, a plurality of terminals 30, a plurality of lead members 40, a plurality of wire members 50, a plurality of conductive blocks 60, and a sealing resin 70. In the present embodiment, the plurality of terminals 30 include two input terminals 31 and 32, an output terminal 33, a pair of gate terminals 34A and 34B, a pair of detection terminals 35A and 35B, and a plurality of dummy terminals 36. The plurality of conductive blocks 60 include a plurality of first blocks 61 and a plurality of second blocks 62.

Figure 2:
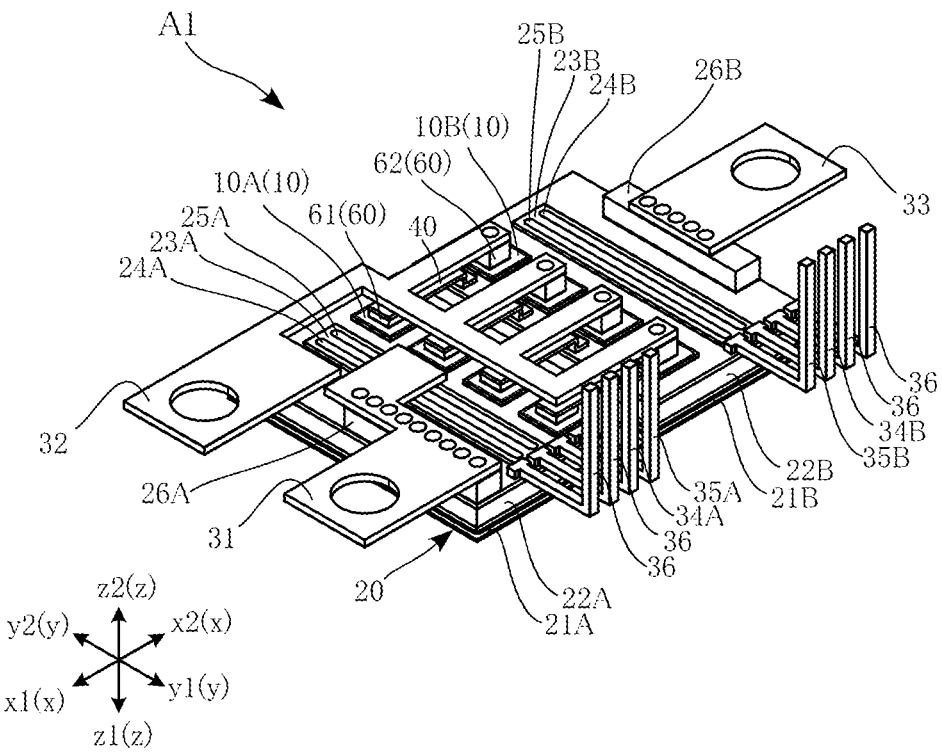
FIG. 2 is the perspective view shown in FIG. 1 from which a sealing resin is omitted.
Figure 3:
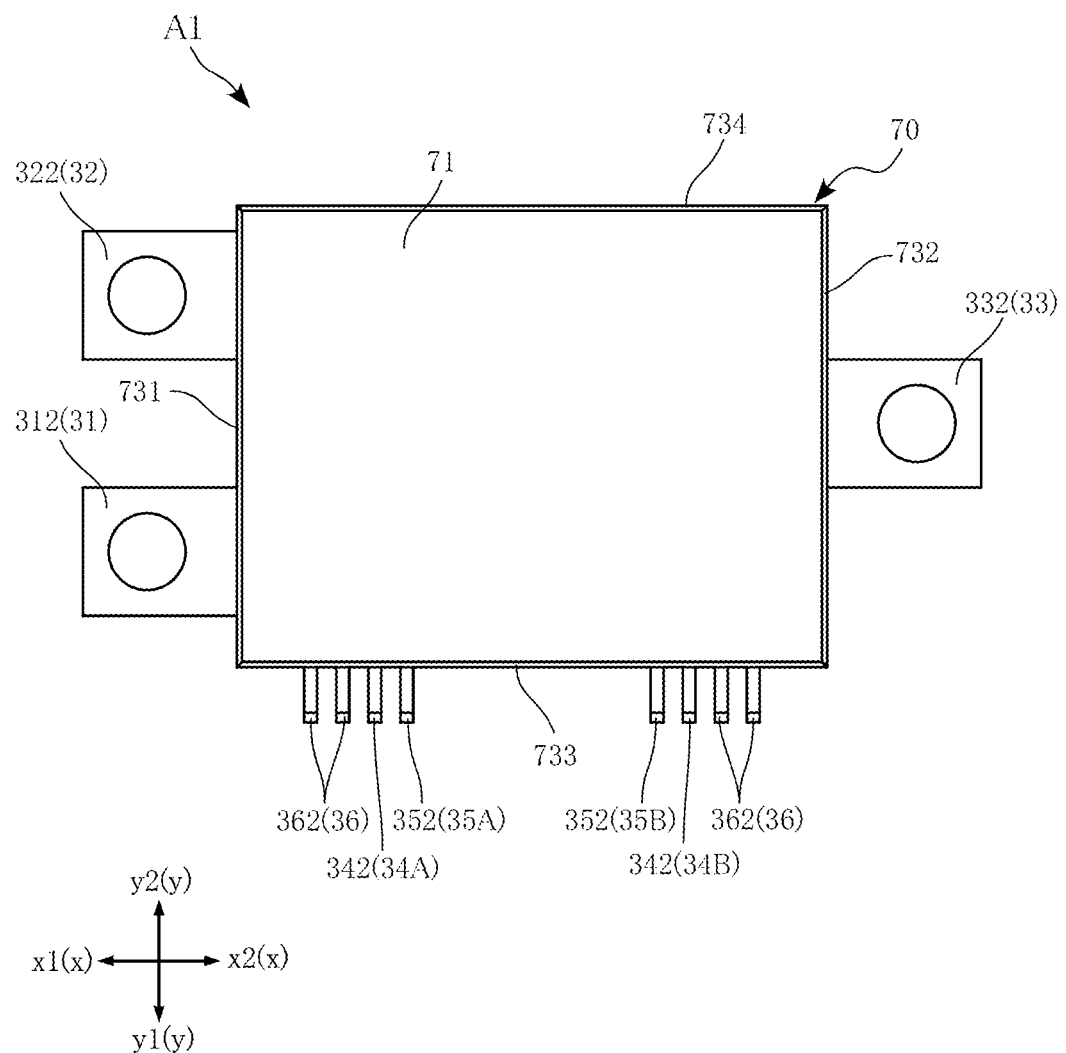
FIG. 3 is a plan view showing the semiconductor device according to the first embodiment.
Figure 4:
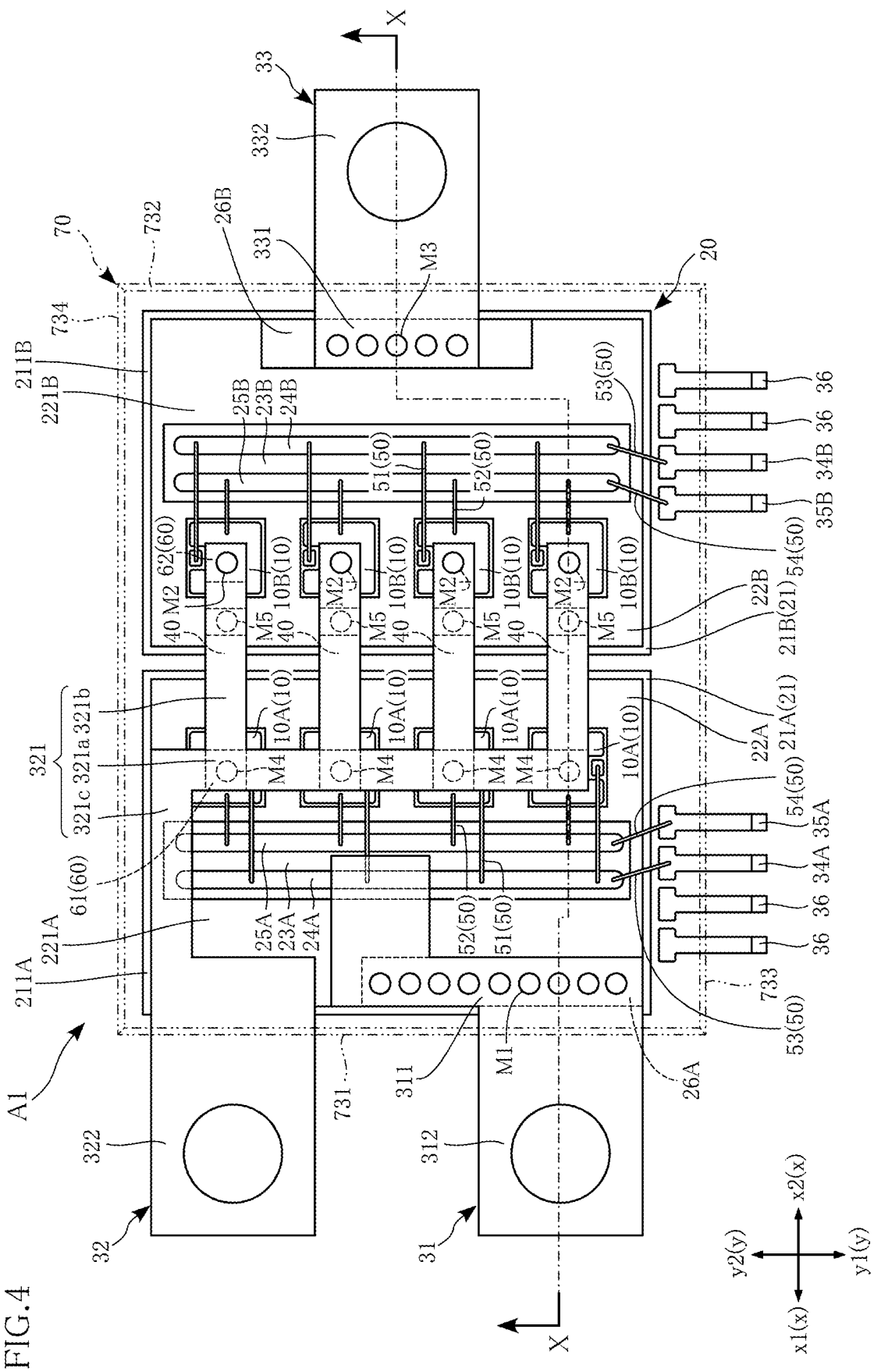
FIG. 4 is the plan view shown in FIG. 3 in which the sealing resin is indicated by imaginary lines.
Figure 5:
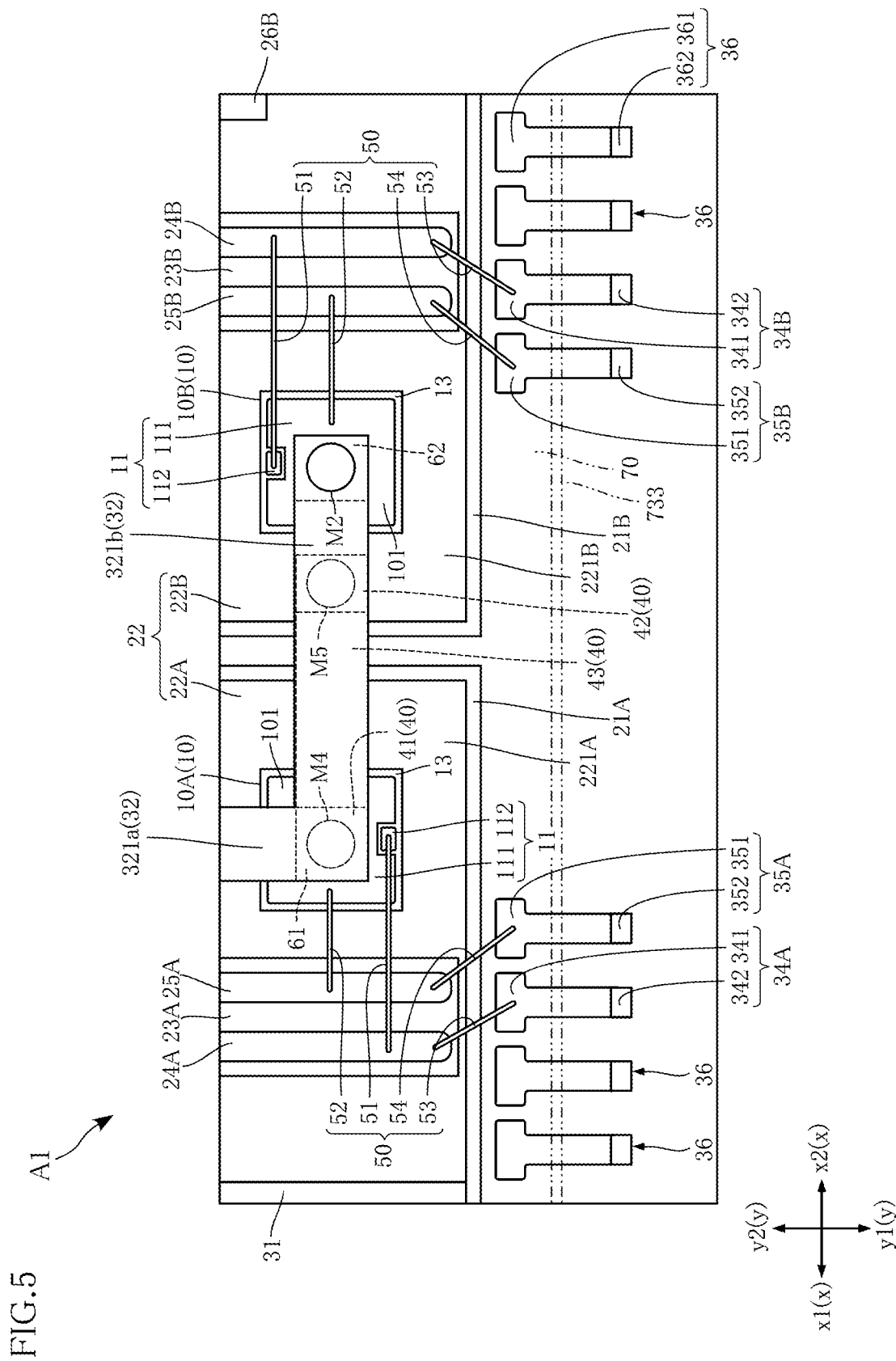
FIG. 5 is a partially enlarged plan view in which a portion of FIG. 4 is enlarged.
Figure 6:
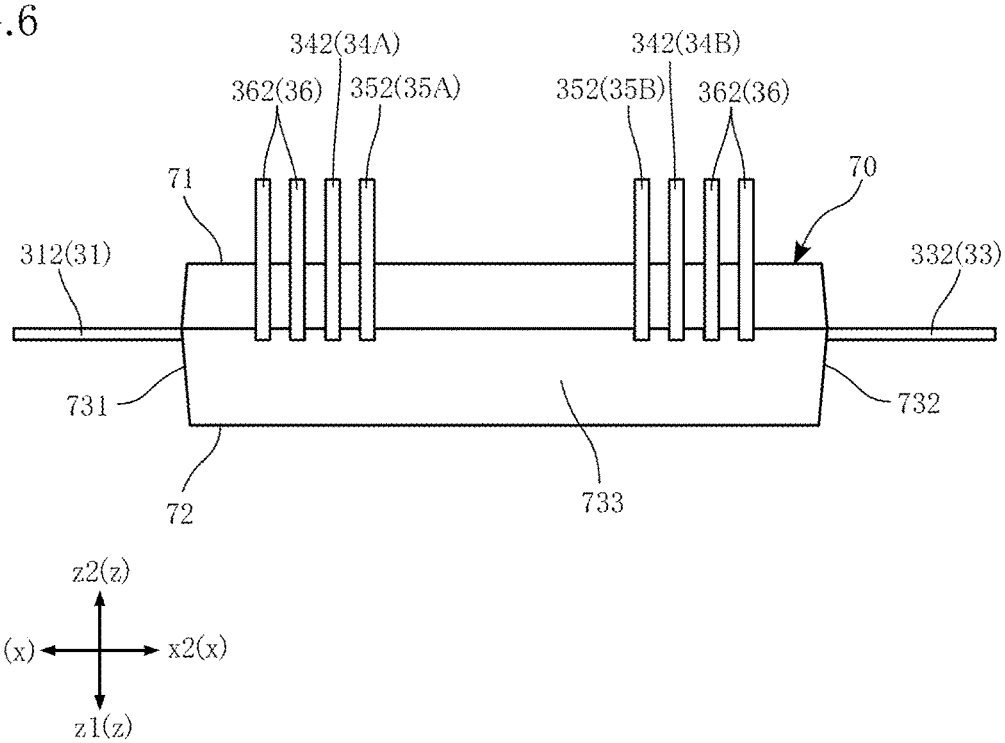
FIG. 6 is a front elevational view showing the semiconductor device according to the first embodiment.
Figure 7:
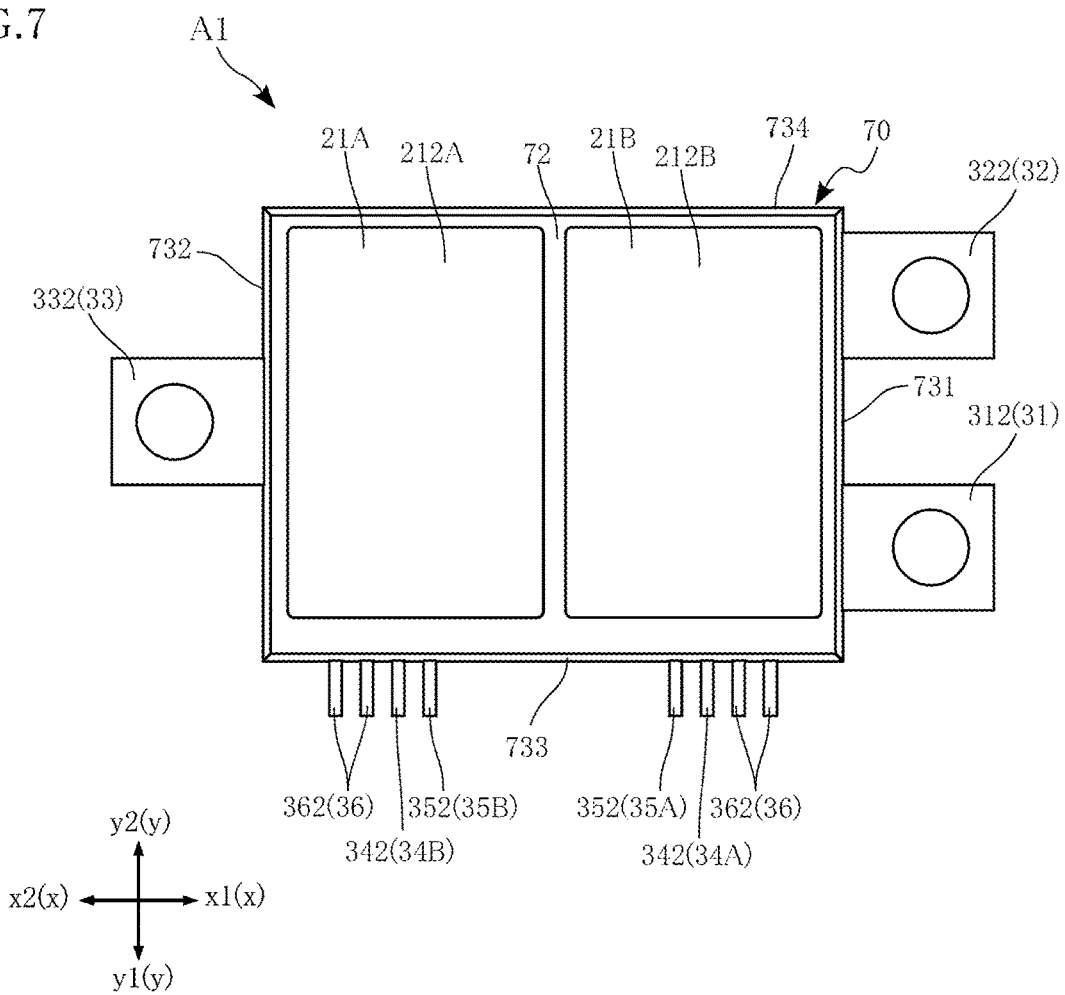
FIG. 7 is a bottom view showing the semiconductor device according to the first embodiment.
Figure 8:
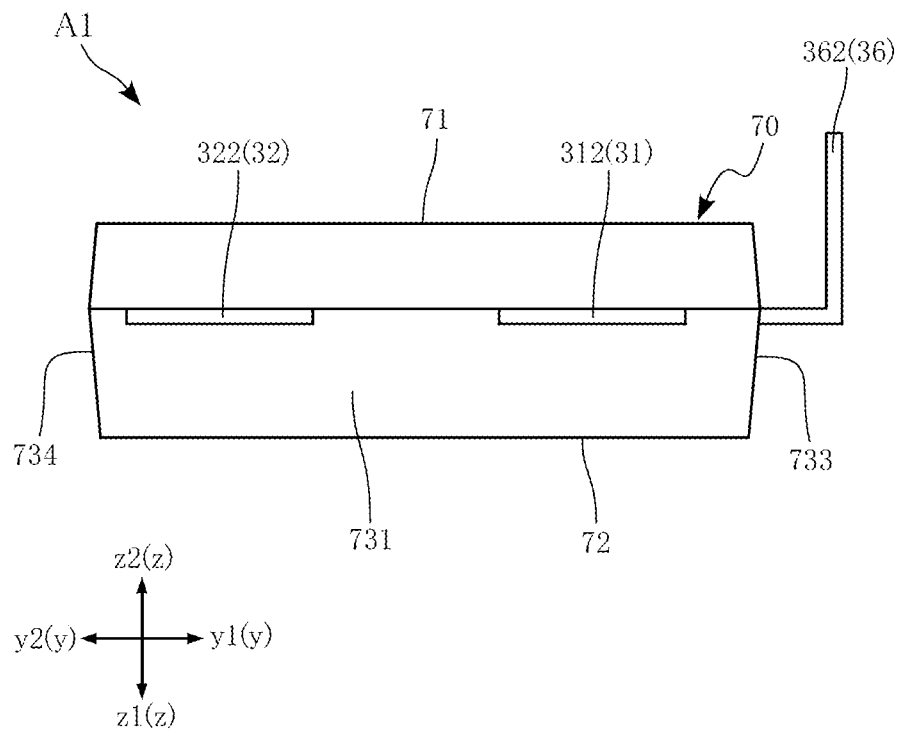
FIG. 8 is a left side view showing the semiconductor device according to the first embodiment.
Figure 9:
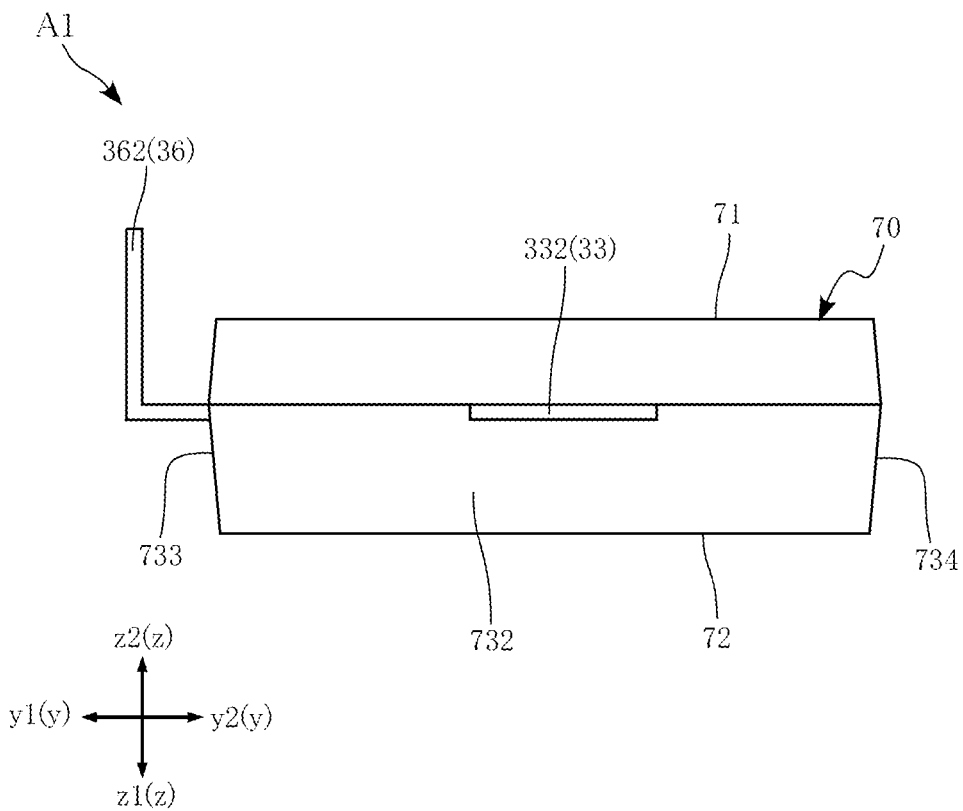
FIG. 9 is a right side view showing the semiconductor device according to the first embodiment.
Figure 10:
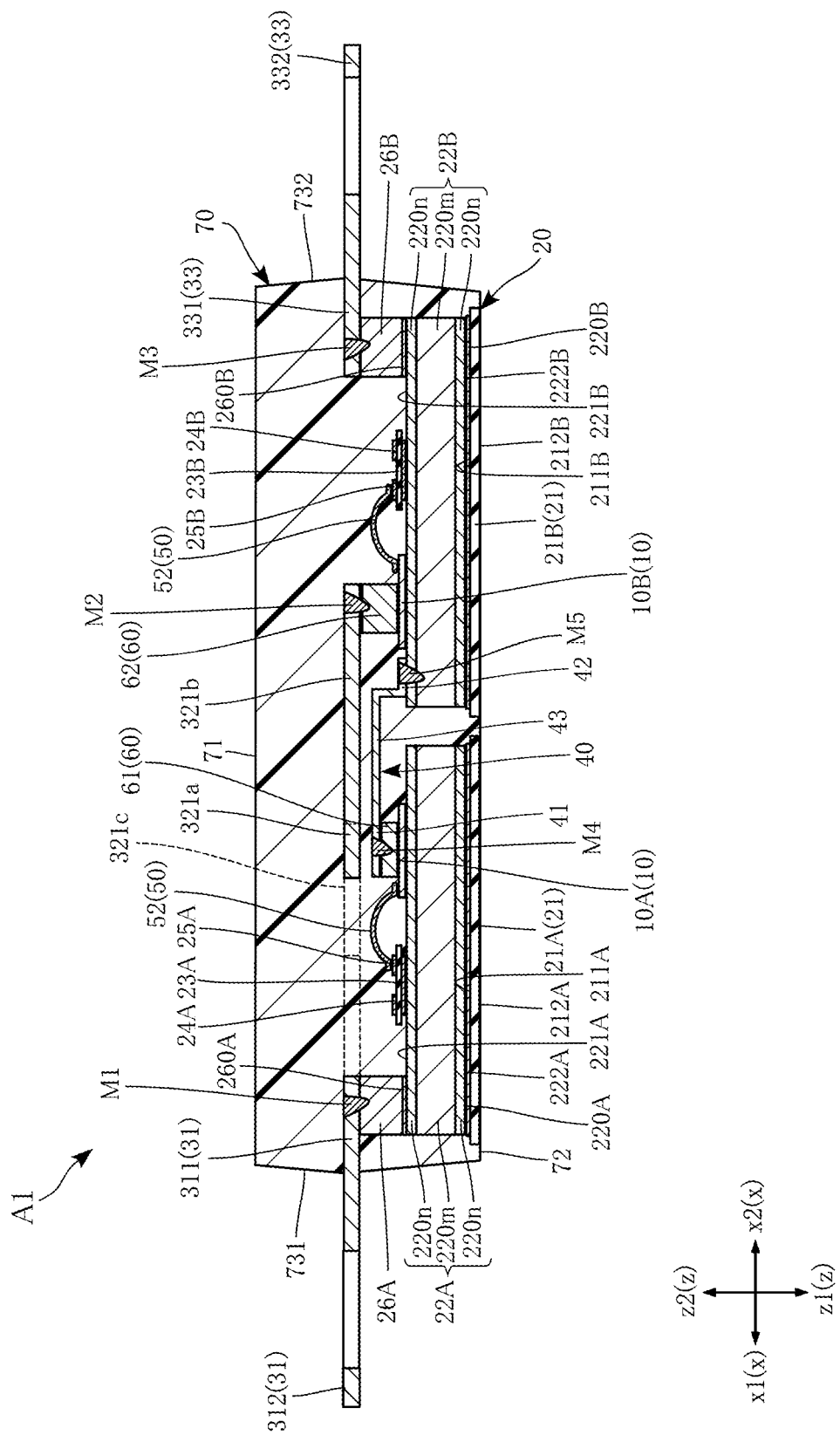
FIG. 10 is a cross-sectional view of FIG. 4 taken along a line X-X.
Figure 11:
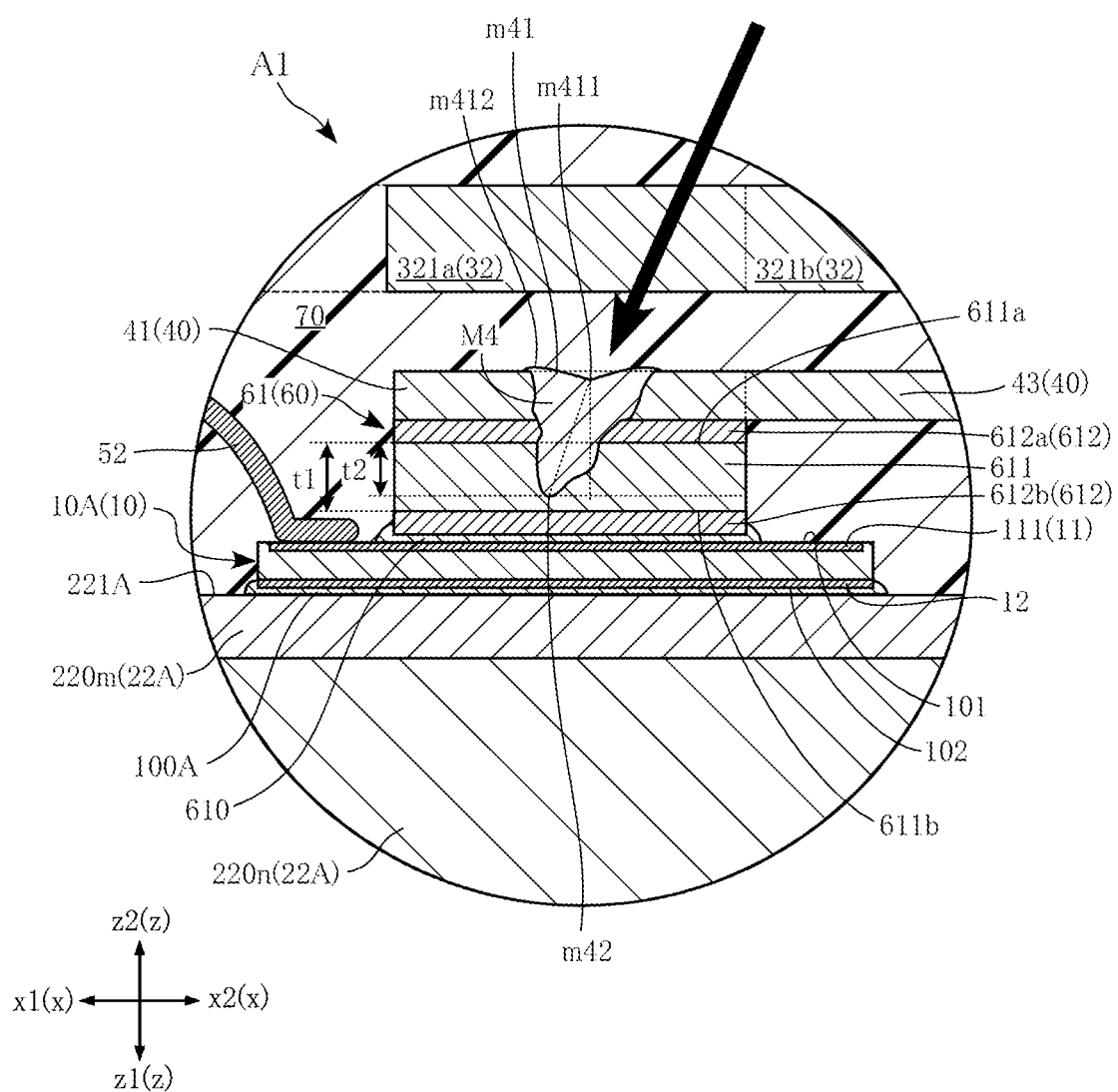
FIG. 11 is a partially enlarged cross-sectional view in which a portion of FIG. 10 is enlarged.
Figure 12:
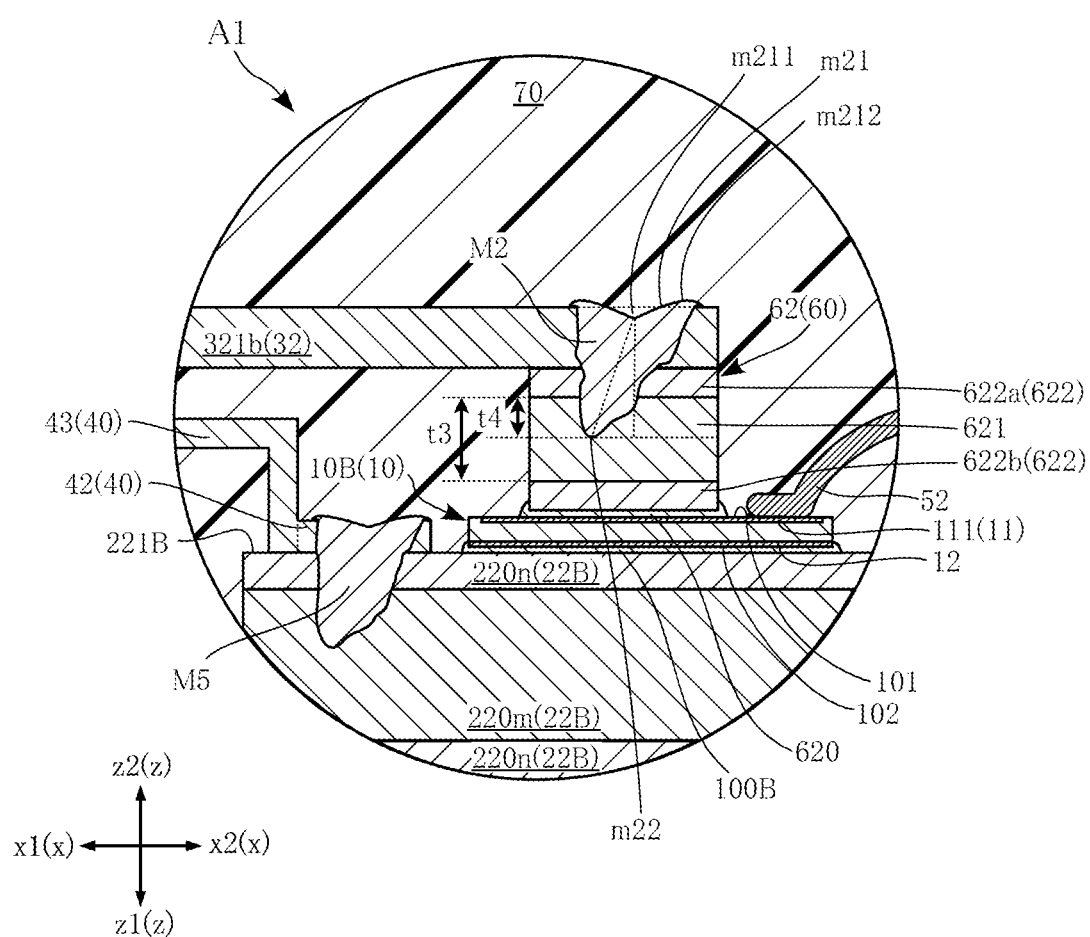
FIG. 12 is a partially enlarged cross-sectional view in which a portion of FIG. 10 is enlarged.

FIG. 1 is a perspective view of the semiconductor device A1. FIG. 2 is the perspective view in FIG. 1 from which the sealing resin 70 is omitted. Note that the plurality of wire members 50 are omitted in FIG. 2. FIG. 3 is a plan view showing the semiconductor device A1. FIG. 4 is the plan view in FIG. 3 in which the sealing resin 70 is indicated by imaginary lines (dash-double dot lines). FIG. 5 is a plan view in which a portion of FIG. 4 is enlarged. FIG. 6 is a plan view showing the semiconductor device A1. FIG. 7 is a bottom view showing the semiconductor device A1. FIG. 8 is a left side view showing the semiconductor device A1. FIG. 9 is a right side view showing the semiconductor device A1. FIG. 10 is a cross-sectional view of FIG. 4 taken along a line X-X. FIG. 11 is a partially enlarged view in which a portion of FIG. 10 is enlarged. FIG. 12 is a partially enlarged view in which a portion of FIG. 10 is enlarged.

For convenience of description, three orthogonal directions are defined as an x direction, a y direction, and a z direction. The z direction is the thickness direction of the semiconductor device A1. The x direction is a left-right direction in the plan view (see FIGS. 3 and 4) of the semiconductor device A1. The y direction is an upward-downward direction in a plan view (see FIGS. 3 and 4) of the semiconductor device A1. Note that a direction toward one side in the x direction is referred to as an x1 direction, and a direction toward the other side in the x direction is referred to as an x2 direction, as necessary. Similarly, a direction toward one side in the y direction is referred to as a y1 direction, a direction toward the other side in the y direction is referred to as a y2 direction, a direction toward one side in the z direction is referred to as a z1 direction, and a direction toward the other side in the z direction is referred to as a z2 direction. The z1 direction and the z2 direction may also be referred to as below and above, respectively. Furthermore, the length in the z2 direction may also be referred to as a "thickness". The z direction may correspond to a "first direction" in the claims.

The plurality of semiconductor elements 10 are made of a semiconductor material mainly composed of SiC (silicon carbide). Note that the semiconductor material is not limited to SiC, and may alternatively be Si (silicon), GaAs (gallium arsenide), GaN (gallium nitride), or the like. The thermal expansion coefficient of SiC is about 3 ppm/° C. In the present embodiment, the semiconductor elements 10 are MOSFETs. Note that the plurality of semiconductor elements 10 are not limited to MOSFETs, and may alternatively be field effect transistors including MISFETs (Metal-Insulator-Semiconductor FETs), bipolar transistors such as IGBTs (Insulated Gate Bipolar Transistors), IC chips such as LSIs, a diode, or a capacitor. The present embodiment describes the case where the semiconductor elements 10 are the same elements and are n-channel MOSFETS. Each of the semiconductor elements 10 has a rectangular shape when viewed in the z direction (hereinafter also referred to as "in a plan view"), but is not limited thereto.

As shown in FIGS. 11 and 12, each of the plurality of semiconductor elements 10 has an element obverse face 101 and an element reverse face 102. In each semiconductor element 10, the element obverse face 101 and the element reverse face 102 are spaced apart from each other in the z direction and face toward opposite sides. In the present embodiment, the element obverse face 101 faces in the z2 direction, and the element reverse face 102 faces in the z1 direction.

As shown in FIGS. 5, 11, and 12, each of the plurality of semiconductor elements 10 has an obverse-face electrode 11, a reverse-face electrode 12, and an insulating film 13.

The obverse-face electrode 11 is provided on the element obverse face 101 as shown in FIGS. 5, 11, and 12. As shown in FIG. 5, the obverse-face electrode 11 includes a first electrode 111 and a second electrode 112. In the present embodiment, the first electrode 111 is a source electrode, and a source current flows therethrough. In the present embodiment, the second electrode 112 is a gate electrode, and a gate voltage for driving the semiconductor element 10 is applied to the second electrode 112. The first electrode 111 is larger than the second electrode 112. Although the present embodiment describes the case where the first electrode 111 is constituted by one region, it may be divided into a plurality of regions.

As shown in FIGS. 11 and 12, the reverse-face electrode 12 is provided on the element reverse face 102. The reverse-face electrode 12 is formed over the entire element reverse face 102. In the present embodiment, the reverse-face electrode 12 is a drain electrode, and a drain current flows therethrough.

As shown in FIG. 5, the insulating film 13 is provided on the element obverse face 101. The insulating film 13 is electrically insulating. The insulating film 13 surrounds the obverse-face electrode 11 in a plan view. The insulating film 13 insulates the first electrode 111 and the second electrode 112 from each other. The insulating film 13 is formed by, for example, stacking a $SiO_2$ (silicon dioxide) layer, a $SiN_4$ (silicon nitride) layer, and a polybenzoxazole layer in this order on the element obverse face 101, and the polybenzoxazole layer is a surface layer. Note that the insulating film 13 may have a polyimide layer in place of the polybenzoxazole layer. The configuration of the insulating film 13 is not limited to the above-described one.

The plurality of semiconductor elements 10 includes a plurality of semiconductor elements 10A and a plurality of semiconductor elements 10B. In the present embodiment, the semiconductor device A1 constitutes a half-bridge switching circuit. The plurality of semiconductor elements 10A constitute an upper arm circuit in this switching circuit, and the plurality of semiconductor elements 10B constitute a lower arm circuit in this switching circuit. As shown in FIG. 4, the semiconductor device A1 includes four semiconductor elements 10A and four semiconductor elements 10B. Note that the number of semiconductor elements 10 is not limited to that in this configuration, and can be freely set in accordance with the required performance of the semiconductor device A1. In the present embodiment, the semiconductor element 10A may correspond to a "first semiconductor element" in the claims, and the semiconductor element 10B may correspond to a "second semiconductor element" in the claims.

As shown in FIGS. 2, 4, 5, 10, and 11, the plurality of semiconductor elements 10A are mounted on the support substrate (later-described conductive substrate 22A). In the present embodiment, the plurality of semiconductor elements 10A are arranged in the y direction and are spaced apart from each other. When each semiconductor element 10A is mounted on the conductive substrate 22A, the element reverse face 102 opposes the conductive substrate 22A. As shown in FIG. 11, the semiconductor elements 10A are conductively bonded to the support substrate 20 (conductive substrate 22A) via the element bonding members 100A.

The element bonding materials 100A are conductive, and the component material thereof is sintered metal that is formed through sintering treatment. The sintered metal is porous and has many micropores. The sintered metal may be formed by performing sintering treatment (drying treatment and pressure heating treatment) on a metal paste material for sintering in which micro- or nano-sized metal particles are mixed in a solvent. The sintered metal in the present embodiment is sintered silver, but may alternatively be sintered copper or the like. Note that the component material of the element bonding materials 100A is not limited to sintered metal and may alternatively be solder. In the present embodiment, fillets are formed on each element bonding material 100A, as shown in FIG. 11. Note that these fillets do not need to be formed. Each element bonding material 100A may correspond to a "second conductive bonding material" in the claims.

As shown in FIGS. 2, 4, 5, 10, and 12, the plurality of semiconductor elements 10B are mounted on the support substrate (later-described conductive substrate 22B). In the present embodiment, the plurality of semiconductor elements 10B are arranged in the y direction and are spaced apart from each other. When each semiconductor element 10B is mounted on the conductive substrate 22B, the element reverse face 102 opposes the conductive substrate 22B. As shown in FIG. 12, the semiconductor elements 10B are conductively bonded to the support substrate 20 (conductive substrate 22B) via the element bonding member 100B. In the present embodiment, the plurality of semiconductor elements 10A and the plurality of semiconductor elements 10B overlap with each other when viewed in the x direction. Note that the plurality of semiconductor elements 10A and the plurality of semiconductor elements 10B does not need to overlap with each other when viewed in the x direction.

The element bonding materials 100B are conductive, and the component material thereof is the same as that of the element bonding materials 100A. In the present embodiment, fillets are formed on each element bonding material 100B, as shown in FIG. 12. Note that these fillets do not need to be formed. In the present embodiment, each element bonding material 100B may correspond to a "second conductive bonding material" in the claims.

The support substrate 20 is a support member that supports the plurality of semiconductor elements 10. The support substrate 20 includes insulating substrates 21, two conductive substrates 22A and 22B, a pair of insulating layers 23A and 23B, a pair of gate layers 24A and 24B, a pair of detection layers 25A and 25B, and two spacers 26A and 26B.

The insulating substrates 21 are electrically insulating plate-shaped members. The insulating substrates 21 support the two conductive substrates 22A and 22B. In the present embodiment, the insulating substrates 21 include two insulating substrates 21A and 21B, each of which has a flat plate shape. Note that the configuration of the insulating substrates 21 is not limited to the above-described configuration. For example, one flat-plate insulating substrate 21 may be employed, rather than two divided insulating substrates 21A and 21B. The component material of the insulating substrates 21A and 21B is a ceramic that has excellent thermal conductivity, for example. Such a ceramic is, for example, AlN (aluminum nitride), SiN (silicon nitride), $Al_2O_3$ (aluminum oxide), and the like.

Each of the insulating substrates 21A and 21B has a rectangular shape in a plan view. The insulating substrate 21A supports the conductive substrate 22A, and the insulating substrate 21B supports the conductive substrate 22B. The insulating substrates 21A and 21B are spaced apart from each other. In the present embodiment, the insulating substrates 21A and 21B are spaced apart from each other in the x direction and are arranged in a line, as shown in FIGS. 2, 4, and 10.

As shown in FIG. 10, the insulating substrate 21A has an obverse-face 211A and a reverse face 212A. The obverse face 211A and the reverse face 212A are spaced apart in the z direction and face in opposite directions. The obverse face 211A faces in the z2 direction, and the reverse face 212A faces in the z1 direction. The obverse face 211A opposes the conductive substrate 22A, and the reverse face 212A is exposed from the sealing resin 70.

As shown in FIG. 10, the insulating substrate 21B has an obverse-face 211B and a reverse face 212B. The obverse face 211B and the reverse face 212B are spaced apart in the z direction and face in opposite directions. The obverse face 211B faces in the z2 direction, and the reverse face 212B faces in the z1 direction. The obverse face 211B opposes the conductive substrate 22B, and the reverse face 212B is exposed from the sealing resin 70.

Each of the conductive substrates 22A and 22B is an electrically conductive plate-shaped member. In the present embodiment, each of the conductive substrates 22A and 22B is a composite substrate that includes a graphite substrate 220$m$ and copper films 220$n$ formed on respective faces in the z direction of the graphite substrate 220$m$, as shown in FIG. 10. Note that the component material of the conductive substrates 22A and 22B is not limited thereto, and may alternatively be copper or a copper alloy. The surfaces of the conductive substrates 22A and 22B may be silver-plated. The conductive substrates 22A and 22B constitute conductive paths to the plurality of semiconductor elements 10, together with the plurality of terminals 30. The conductive substrates 22A and 22B are spaced apart from each other. As shown in FIGS. 4 and 10, the conductive substrates 22A and 22B are spaced apart from each other in the x direction and are arranged in a line. As shown in FIG. 4, both the conductive substrates 22A and 22B have a rectangular shape in a plan view. Both the conductive substrates 22A and 22B have a length in the z direction of about 0.4 to 3.0 mm. In the present embodiment, the length in the z direction of the graphite substrate 220m is about 0.5 to 2.5 mm, and the length in the z direction of each of the two copper films 220n is about 0.25 to 0.5 mm. Note that these lengths in the z directions are not limited to the aforementioned lengths.

As shown in FIG. 10, the conductive substrate 22A is bonded to the insulating substrate 21A via a substrate bonding material 220A. The substrate bonding material 220A may be, for example, a conductive bonding material such as silver paste, solder, or sintered metal, or may be an insulating bonding material. As shown in FIGS. 4 and 10, the conductive substrate 22A is located farther in the x1 direction than the conductive substrate 22B. The entire conductive substrate 22A overlaps with the conductive substrate 22B when viewed in the x direction. In the present embodiment, the conductive substrate 22A may correspond to a "first conductor" in the claims.

As shown in FIG. 10, the conductive substrate 22A has an obverse-face 221A and a reverse face 222A. The obverse face 221A and the reverse face 222A are spaced apart from each other in the z direction and face in opposite directions. The obverse face 221A faces in the z2 direction, and the reverse face 222A faces in the z1 direction. The plurality of semiconductor elements 10A are mounted on the obverse face 221A. The insulating layer 23A is bonded onto the obverse face 221A.

As shown in FIG. 10, the conductive substrate 22B is bonded to the insulating substrate 21B via a substrate bonding material 220B. Note that the substrate bonding material 220B may be, for example, a conductive bonding material such as silver paste, solder, or sintered metal, or may be an insulating bonding material. In the present embodiment, the conductive substrate 22B may correspond to a "second conductor" in the claims.

As shown in FIG. 10, the conductive substrate 22B has an obverse-face 221B and a reverse face 222B. The obverse face 221B and the reverse face 222B are spaced apart from each other in the z direction and face in opposite directions. The obverse face 221B faces in the z2 direction, and the reverse face 222B faces in the z1 direction. The plurality of semiconductor elements 10B are mounted onto the obverse face 221B. The insulating layer 23B and one end of each of the plurality of lead members 40 are bonded to the obverse face 221B.

The pair of insulating layers 23A and 23B are electrically insulating, and the component material thereof is glass epoxy resin or a ceramic, for example. As shown in FIG. 4, each of the two insulating layers 23A and 23B has a band shape extending in the y direction. As shown in FIGS. 4 and 10, the insulating layer 23A is bonded to the obverse face 221A of the conductive substrate 22A. The insulating layer 23A is located farther in the x1 direction than the plurality of semiconductor elements 10A. Note that, conversely, the insulating layer 23A may alternatively arranged farther in the x2 direction than the plurality of semiconductor elements 10A. As shown in FIGS. 4 and 10, the insulating layer 23B is bonded to the obverse face 221B of the conductive substrate 22B. The insulating layer 23B is located farther in the x2 direction than the plurality of semiconductor elements 10B. Note that, conversely, the insulating layer 23B may alternatively arranged farther in the x1 direction than the plurality of semiconductor elements 10B.

The pair of gate layers 24A and 24B are conductive, and the component material thereof is copper of a copper alloy, for example. As shown in FIG. 4, each of the two gate layers 24A and 24B have a band shape extending in the y direction. Note that the shape of each of the two gate layers 24A and 24B is not limited to the shape shown in FIG. 4. As shown in FIGS. 4 and 10, the gate layer 24A is arranged on the insulating layer 23A. The gate layer 24A is electrically continuous to the second electrodes 112 (gate electrodes) of the semiconductor elements 10A via the wire members 50 (later-described gate wires 51). As shown in FIGS. 4 and 10, the gate layer 24B is arranged on the insulating layer 23B. The gate layer 24B is electrically continuous to the second electrodes 112 (gate electrodes) of the semiconductor elements 10B via the wire members 50 (later-described gate wires 51).

The pair of detection layers 25A and 25B are conductive, and the component material thereof is copper or a copper alloy, for example. As shown in FIG. 4, each of the two detection layers 25A and 25B has a band shape extending in the y direction. Note that the shape of each of the two detection layers 25A and 25B is not limited to that shown in FIG. 4. As shown in FIGS. 4 and 10, the detection layer 25A is arranged on the insulating layer 23A together with the gate layer 24A. In a plan view, the detection layer 25A is located adjacent to the gate layer 24A and is spaced apart from the gate layer 24A on the insulating layer 23A. In the present embodiment, the detection layer 25A is arranged closer, in the x direction, to the plurality of semiconductor elements 10A than the gate layer 24A. Accordingly, the detection layer 25A is located in the x2 direction with respect to the gate layer 24A. Note that the arrangement in the x direction of the gate layer 24A and the detection layer 25A may be reversed. The detection layer 25A is electrically continuous to the first electrodes 111 (source electrodes) of the semiconductor elements 10A via the wire members 50 (later-described detection wires 52). As shown in FIGS. 4 and 10, the detection layer 25B is arranged together with the gate layer 24B on the insulating layer 23B. In a plan view, the detection layer 25B is located adjacent to the gate layer 24B and is spaced apart from the gate layer 24B on the insulating layer 23B. In the present embodiment, the detection layer 25B is arranged closer to the plurality of semiconductor elements 10B than the gate layer 24B. Accordingly, the detection layer 25B is located in the x1 direction with respect to the gate layer 24B. Note that the arrangement in the x direction of the gate layer 24B and the detection layer 25B may be reversed. The detection layer 25B is electrically continuous to the first electrodes 111 (source electrodes) of the semiconductor elements 10B via the wire members 50 (later-described detection wires 52).

The two spacers 26A and 26B are conductive, and the component material thereof is copper or a copper alloy, for example. Note that the component material of the spacers 26A and 26B is not limited to the above-described one, and may be, for example, a CuMo (copper-molybdenum) composite material, a CIC (Copper-Inver-Copper) composite material, or the like. The composite materials of the spacers 26A and 26B may differ from each other.

As shown in FIG. 10, the spacer 26A is interposed between the conductive substrate 22A and the input terminal 31. As shown in FIG. 4, the spacer 26A has a rectangular shape that extends in the y direction in a plan view. The spacer 26A is bonded to the conductive substrate 22A via a spacer bonding material 260A. The spacer bonding material 260A is, for example, a conductive bonding material such as silver paste, solder, or sintered metal. The spacer 26A is located close to an end edge in the x1 direction of the conductive substrate 22A in a plan view. The spacer 26A is provided to position the input terminal 31 at substantially the same position in the z direction as the input terminal 32.

Note that a configuration may alternatively be employed in which the spacer 26A is not provided and the input terminal 31 is directly bonded to the conductive substrate 22A. The shape of the spacer 26A is not specifically limited. In the present embodiment, the spacer 26A may correspond to a "first spacer" in the claims.

As shown in FIG. 10, the spacer 26B is interposed between the conductive substrate 22B and the input terminal 33. As shown in FIG. 4, the spacer 26B has a rectangular shape that extends in the y direction in a plan view. The spacer 26B is bonded to the conductive substrate 22B via a spacer bonding material 260B. The spacer bonding material 260B is, for example, a conductive bonding material similar to the spacer bonding material 260A. The spacer 26B is located close to an end edge in the x2 direction of the conductive substrate 22B in a plan view. The spacer 26B is provided to position the output terminal 33 at substantially the same position in the z direction as the input terminal 32. Note that a configuration may alternatively be employed in which the spacer 26B is not provided and the output terminal 33 is directly bonded to the conductive substrate 22B. The shape of the spacer 26B is not specifically limited. In the present embodiment, the spacer 26B may correspond to a "second spacer" in the claims.

Each of the plurality of terminals 30 includes a portion located within the sealing resin 70 and a portion located outside the sealing resin 70. That is to say, each terminal 30 includes a portion covered by the sealing resin 70 and a portion exposed from the sealing resin 70. The terminals 30 are used when the semiconductor device A1 is mounted to a circuit board of an electronic device or the like.

The two input terminals 31 and 32 are metal plates. The component material of these metal plates is copper or a copper alloy. Note that the component material of the input terminals 31 and 32 is not limited thereto, and may alternatively be, for example, copper or a copper alloy that is Ni-plated, or may be aluminum. In the present embodiment, both the two input terminals 31 and 32 have a length in the z direction of about 0.8 mm. Note that the length in the z direction of each of the input terminals 31 and 32 is not limited thereto. Both the two input terminals 31 and 32 are located closer to the side in the x1 direction in the semiconductor device A1, as shown in FIGS. 1 to 4 and 7. For example, a power supply voltage is applied between the two input terminals 31 and 32. The input terminal 31 is a positive terminal (P-terminal), and the input terminal 32 is a negative terminal (N-terminal). The input terminals 31 and 32 are spaced apart from each other. The input terminal 32 is spaced apart from the conductive substrate 22A.

As shown in FIG. 4, the input terminal 31 has a pad portion 311 and a terminal portion 312. In the present embodiment, the input terminal 31 may correspond to a "first terminal" in the claims.

The pad portion 311 is a portion of the input terminal 31 that is covered by the sealing resin 70. The pad portion 311 is electrically connected to the conductive substrate 22A via a spacer 26A. As shown in FIGS. 2, 4, and 10, the pad portion 311 is bonded to the spacer 26A. In the present embodiment, the pad portion 311 and the spacer 26A are bonded to each other by a plurality of weld portions M1. Note that the number of weld portions M1 is not limited. Each weld portion M1 is a welding mark that is formed by laser welding, and is a portion at which a portion of each pad portion 311 (input terminal 31) and a portion of the spacer 26A are welded to each other. Accordingly, the pad portion 311 is bonded to the spacer 26A by laser welding. In the present embodiment, each weld portion M1 may correspond to a "third weld portion" in the claims.

The terminal portion 312 is a portion of the input terminal 31 that is exposed from the sealing resin 70. As shown in FIGS. 3, 4, 6, 7, and 10, the terminal portion 312 extends in the x1 direction from the sealing resin 70.

As shown in FIG. 4, the input terminal 32 has a pad portion 321 and a terminal portion 322. In the present embodiment, the input terminal 32 may correspond to a "second terminal" in the claims. Also, in the present embodiment, the input terminal 32 also may correspond to a "metal member" in the claims.

The pad portion 321 is a portion of the input terminal 32 that is covered by the sealing resin 70. The pad portion 321 includes a joint portion 321a, a plurality of extending portions 321b, and a connection portion 321c.

The joint portion 321a has a band shape extending in the y direction. The joint portion 321a connects the plurality of extending portions 321b.

The plurality of extending portions 321b have a band shape respectively extending in the x1 direction from the joint portion 321a. In the present embodiment, each extending portion 321b extends in the x direction from the joint portion 321a until it/the extending portion 321b overlaps with the corresponding semiconductor element 10B in a plan view. Each extending portion 321b extends from the conductive substrate 22A to the conductive substrate 22B in a plan view. A leading end portion of each extending portion 321b overlaps with the corresponding second block 62 in a plan view. The plurality of extending portions 321b are arranged in a line in the y direction and are spaced apart from each other in a plan view. The extending portions 321b are electrically connected to the first electrodes 111 (source electrodes) of the semiconductor elements 10B via the plurality of conductive blocks 60. As shown in FIGS. 4, 10, and 12, a leading end portion of each extending portion 321b is bonded to the corresponding second block 62. In the present embodiment, each extending portion 321b and the corresponding second block 62 are bonded to each other by a weld portion M2. Each of the plurality of weld portions M2 is a welding mark that is formed by laser welding, and is a portion at which a portion of each extending portion 321b (input terminal 32) and a portion of the corresponding second block 62 are welded to each other. Accordingly, the extending portions 321b are bonded to the second blocks 62 by laser welding. In the present embodiment, each weld portion M2 may correspond to a "weld portion" in the claims. Note that when the weld portion M2 may correspond to the "weld portion" in the claims, each second block 62, the input terminal 32, and each semiconductor element 10B correspond to a "conductive block", a "metal member", and a "semiconductor element", respectively.

The connection portion 321c is a portion that connects the joint portion 321a and the terminal portion 322 to each other. In the present embodiment, the connection portion 321c extends in the x1 direction from an end edge of the joint portion 321a on the side in the y2 direction and in the x1 direction in a plan view, as shown in FIG. 4.

The terminal portion 322 is a portion of the input terminal 32 that is exposed from the sealing resin 70. As shown in FIGS. 1, 3, 4, and 7, the terminal portion 322 extends in the x1 direction from the sealing resin 70. The terminal portion 322 has a rectangular shape in a plan view. As shown in FIGS. 3, 4, and 7, the terminal portion 322 is located farther in the y2 direction than the terminal portion 312 of the input terminal 31 in a plan view. Note that, in the present embodiment, the shape of the terminal portion 322 is the same as the shape of the terminal portion 312.

The output terminal 33 is a metal plate. The component material of this metal plate is copper or a copper alloy, for example. Note that the component material of the output terminal 33 is not limited thereto, and may alternatively be copper or a copper alloy that is Ni-plated, or may be aluminum, for example. As shown in FIGS. 1 to 4, 6, 7, and 10, the output terminal 33 is located closer to the side in the x2 direction in the semiconductor device A1. AC power (voltage) converted by a plurality of semiconductor elements 10 is output from this output terminal 33.

As shown in FIGS. 4 and 10, the output terminal 33 includes a pad portion 331 and a terminal portion 332. In the present embodiment, the output terminal 33 may correspond to a "third terminal" in the claims.

The pad portion 331 is a portion of the output terminal 33 that is covered by the sealing resin 70. The pad portion 331 is electrically connected to the conductive substrate 22B via the spacer 26B. As shown in FIGS. 2, 4, and 10, the pad portion 331 is bonded to the spacer 26B. In the present embodiment, the pad portion 331 and the spacer 26B are bonded to each other by a plurality of weld portions M3. Note that the number of weld portions M3 is not limited. Each weld portion M3 is a welding mark that is formed by laser welding, and is a portion at which a portion of the pad portion 331 (output terminal 33) and a portion of the spacer 26B are welded to each other. Accordingly, the pad portion 331 is bonded to the spacer 26B by laser welding. In the present embodiment, each weld portion M3 may correspond to a "fourth weld portion" in the claims.

The terminal portion 332 is a portion of the output terminal 33 that is exposed from the sealing resin 70. As shown in FIGS. 3, 4, 6, 7, and 10, the terminal portion 332 extends in the width direction x2 from the sealing resin 70.

As shown in FIGS. 1 to 7, the two gate terminals 34A and 34B are located adjacent, in the y direction, to the respective conductive substrates 22A and 22B. A gate voltage for driving the plurality of semiconductor elements 10A is applied to the gate terminal 34A. A gate voltage for driving the plurality of semiconductor elements 10B is applied to the gate terminal 34B.

As shown in FIG. 5, each of the two gate terminals 34A and 34B has a pad portion 341 and a terminal portion 342. The pad portion 341 of each of the gate terminals 34A and 34B is covered by the sealing resin 70. The gate terminals 34A and 34B are supported by the sealing resin 70. The terminal portion 342 is continuous with the pad portion 341, and is exposed from the sealing resin 70. The terminal portion 342 forms an L shape when viewed in the x direction. In the present embodiment, the terminal portion 342 protrudes from a face (later-described resin side face 733) of the sealing resin 70 that faces in the y1 direction.

As shown in FIGS. 1 to 7, the two detection terminals 35A and 35B are located adjacent, in the x direction, to the gate terminals 34A and 34B, respectively. A voltage (a voltage corresponding to the source current) applied to the obverse-face electrodes 11 (first electrodes 111) of the plurality of semiconductor elements 10A is detected from the detection terminal 35A. A voltage (a voltage corresponding to the source current) applied to the obverse-face electrodes 11 (first electrodes 111) of the plurality of semiconductor elements 10B is detected from the detection terminal 35B.

As shown in FIG. 5, each of the two detection terminals 35A and 35B has a pad portion 351 and a terminal portion 352. The pad portion 351 of each of the detection terminals 35A and 35B is covered by the sealing resin 70. The detection terminals 35A and 35B are supported by the sealing resin 70. The terminal portion 352 is continuous with the pad portion 351, and is exposed from the sealing resin 70. The terminal portion 352 forms an L shape when viewed in the x direction. In the present embodiment, the terminal portion 352 protrudes from a face (later-described resin side face 733) of the sealing resin 70 that faces in the y1 direction.

As shown in FIGS. 1 to 7, the plurality of dummy terminals 36 are located on the side opposite, in the x direction, to the pair of gate terminals 34A and 34B with respect to the pair of detection terminals 35A and 35B. In the present embodiment, four dummy terminals 36 are provided. Two of these dummy terminals 36 are located on one side in the x direction (i.e., in the x2 direction). The remaining two dummy terminals 36 are located on the other side in the x direction (i.e., in the x1 direction). Note that the configuration of the plurality of dummy terminals is not limited to the above-described configuration. A configuration in which the plurality of dummy terminals 36 are not provided may alternatively be employed.

As shown in FIG. 5, each of the plurality of dummy terminals 36 has a pad portion 361 and a terminal portion 362. In each dummy terminal 36, the pad portion 361 is covered by the sealing resin 70. The plurality of dummy terminals 36 are supported by the sealing resin 70. The terminal portion 362 is continuous with the pad portion 361, and is exposed from the sealing resin 70. The terminal portion 362 forms an L shape when viewed in the x direction. In the present embodiment, the terminal portion 362 protrudes from a face (later-described resin side face 733) of the sealing resin 70 that faces in the y1 direction.

In the present embodiment, the gate terminals 34A and 34B, the detection terminals 35A and 35B, and the dummy terminals 36 have substantially the same shape. These terminals are arranged along the x direction as shown in FIGS. 1 to 7. In the semiconductor device A1, the terminals 30 (the input terminals 31 and 32, the output terminal 33, the pair of gate terminals 34A and 34B, the pair of detection terminals 35A and 35B, and the plurality of dummy terminals 36) are formed from the same lead frame.

The plurality of lead members 40 are for connecting the semiconductor elements 10A and the conductive member 22B to each other. The component material of the lead members 40 is, for example, copper or a copper alloy. Furthermore, for example, Ni plating may be applied to the component material of the lead members 40. Note that the component material of the lead members is not limited thereto, and may alternatively be a clad material such as CIC, aluminum, or the like. Each lead member 40 is a flat connection member. As shown in FIG. 4, each lead member 40 has a rectangular shape that extends in the x direction in a plan view. The lead members 40 overlap with the respective extending portions 321b of the input terminal 32 in a plan view. In the present embodiment, each lead member 40 may correspond to a "metal member" in the claims.

As shown in FIG. 10, each lead member 40 includes a first bonding portion 41, a second bonding portion 42, and a connecting portion 43.

As shown in FIGS. 10 and 11, the first bonding portion 41 is a portion that is bonded to a corresponding first block 61. In the present embodiment, the first bonding portion 41 and the first block 61 are welded to each other by a weld portion M4. The weld portion M4 is a welding mark formed by laser welding, and is a portion at which a portion of the first bonding portion 41 (lead member 40) and a portion of the first block 61 are welded to each other. Accordingly, the first bonding portion 41 is bonded to the first block 61 by laser welding. The first bonding portion 41 overlaps with the first block 61 and the first electrode 111 of the corresponding semiconductor element 10A in a plan view. In the present embodiment, each weld portion M4 may correspond to a "weld portion" and "a first weld portion" in the claims. Note that when the weld portion M4 may correspond to the "weld portion" in the claims, each first block 61, each lead member 40, and each semiconductor element 10A correspond to a "conductive block", a "metal member", and a "semiconductor element", respectively.

As shown in FIGS. 10 and 12, the second bonding portion 42 is a portion that is bonded to the conductive substrate 22B. In the present embodiment, the second bonding 42 and the conductive substrate 22B are welded to each other by a weld portion M5. Each weld portion M5 is a welding mark formed by laser welding, and is a portion at which a portion of the second bonding portion 42 (lead member 40) and a portion of the conductive substrate 22B are welded to each other. Accordingly, the second bonding portion 42 is bonded to the conductive substrate 22B by laser welding. In the z direction, the second bonding portion 42 is located farther in the z1 direction than the first bonding portion 41. The first bonding portion 41 and the second bonding portion 42 have substantially the same length in the z direction. In the present embodiment, each weld portion M5 may correspond to a "second weld portion" in the claims.

The connecting portion 43 is a portion continuous with the first bonding portion 41 and the second bonding portion 42. The length in the z direction of the connecting portion 43 is the same as that of the first bonding portion 41 and the second bonding portion 42. In the present embodiment, a portion of the connecting portion 43 is bent in the z direction. The first bonding portion 41 and the second bonding portion 42, which are located at different position in the z direction, are connected by bending the connecting portion 43.

The plurality of wire members 50 are so-called bonding wires. Each wire member 50 is conductive, and the component material thereof is any one of aluminum, gold, and copper, for example. In the present embodiment, the plurality of wire members 50 include a plurality of gate wires 51, a plurality of detection wires 52, a pair of first connection wires 53, and a pair of second connection wires 54, as shown in FIGS. 4 and 5.

As shown in FIG. 5, one end of each of the plurality of gate wires 51 is bonded to the second electrode 112 (gate electrode) of the corresponding semiconductor element 10, and the other end is bonded to one of the two gate layers 24A and 24B. The plurality of gate wires 51 include gate wires 51 that make the second electrodes 112 of the semiconductor elements 10A and the gate layer 24A electrically continuous, and gate wires 51 that make the second electrodes 112 of the semiconductor elements 10B and the gate layer 24B electrically continuous.

As shown in FIG. 5, one end of each of the plurality of detection wires 52 is bonded to the first electrode 111 (source electrode) of the corresponding semiconductor element 10, and the other end is bonded to one of the two detection layers 25A and 25B. The plurality of detection wires 52 include detection wires that make the first electrodes 111 of the semiconductor elements 10A and the detection layer 25A electrically continuous, and detection wires 52 that make the first electrodes 111 of the semiconductor elements 10B and the detection layer 25B electrically continuous.

As shown in FIG. 5, one of the two first connection wires 53 connects the gate layer 24A and the gate terminal 34A to each other, and the other one connects the gate layer 24B and the gate terminal 34B to each other. One end of one of the first connection wires 53 is bonded to the gate layer 24A, and the other end is bonded to the pad portion 341 of the gate terminal 34A, thus making the gate layer 24A and the gate terminal 34A electrically continuous. One end of the other one of the first connection wires 53 is bonded to the gate layer 24B, and the other end is bonded to the pad portion 341 of the gate terminal 34B, thus making the gate layer 24B and the gate terminal 34B electrically continuous.

As shown in FIG. 5, one of the two second connection wires 54 connects the detection layer 25A and the detection terminal 35A to each other, and the other one connects the detection layer 25B and the detection terminal 35B to each other. One end of one of the second connection wires 54 is bonded to the detection layer 25A, and the other end is bonded to the pad portion 351 of the detection terminal 35A, thus making the detection layer 25A and the detection terminal 35A electrically continuous. One end of the other one of the second connection wires 54 is bonded to the detection layer 25B, and the other end is bonded to the pad portion 351 of the detection terminal 35B, thus making the detection layer 25B and the detection terminal 35B electrically continuous.

The plurality of conductive blocks 60 are conductive. Each of the plurality of conductive blocks 60 is bonded onto the corresponding semiconductor element 10. The length in the z direction of each conductive block 60 is about 0.1 to 2.0 mm. Note that the length in the z direction of each conductive block 60 is not limited thereto. The plurality of conductive blocks 60 include a plurality of first blocks 61 and a plurality of second blocks 62.

Each of the plurality of first blocks 61 is bonded to one of the plurality of semiconductor elements 10A. As shown in FIG. 11, each first block 61 is bonded to the corresponding semiconductor element 10A via a block bonding material 610. The component material of the block bonding material 610 is, for example, solder. Note that the component material is not limited to solder, and may alternatively be a conductive bonding material such as silver paste or sintered metal. The block bonding material 610 is interposed between each first block 61 and the corresponding semiconductor element 10A. The block bonding material 610 may correspond to a "first conductive bonding material" in the claims. Each first block 61 opposes the element obverse face 101 of the corresponding semiconductor element 10A. In the present embodiment, each first block 61 is a columnar body and has a substantially rectangular shape in a plan view, as shown in FIGS. 4, 10, and 11. Note that the shape of each first block 61 in a plan view is not limited thereto, and may alternatively be a circular shape, an elliptical shape, or a polygonal shape.

As shown in FIG. 11, each first block 61 includes a first layer 611 and a pair of second layers 612. The first layer 611 has a first face 611a and a second face 611b. The first face 611a faces in the z2 direction. The second face 611b faces in the z1 direction. The pair of second layers 612 includes a first-face covering layer 612a and a second-face covering layer 612b. The first-face covering layer 612a covers the first face 611a. The second-face covering layer 612b covers the second face 611b. Accordingly, the first layer 611 is sandwiched by the first-face covering layer 612a and the second-face covering layer 612b, i.e., the two second layers 612. Note that the configuration of each first block 61 is not limited thereto, and each first block 61 may alternatively be constituted solely by the first layer 611. That is to say, each first block 61 may be composed of a single material, rather than being a laminated material.

In each first block 61, the first layer 611 is made of a material with a lower thermal expansion coefficient than that of the lead members 40. In the present embodiment, the first layer 611 is made of a material with a thermal expansion coefficient of about 0 to 10 ppm/° C., for example. Note that the thermal expansion coefficient of copper, which is the component material of the lead members 40, is about 17 ppm/° C. For example, the component material of the first layer 611 is Inver (Fe-36Ni). The thermal expansion coefficient of Inver is about 1 ppm/° C. Note that the component material of the first layer 611 is not limited to Inver, and may alternatively be an alloy such as Super-Inver (Fe-32Ni-5Co), Kobar (Fe-29Ni-17Co), or a CuMo sintered compact. The component material of the pair of second layers 612 (the first-face covering layer 612a and the second-face covering layer 612b) is copper. Accordingly, in the present embodiment, the component material of each first block 61 is so-called CIC. The length in the z direction of the first layer 611 is about three times the length in the z direction of each of the second layers 612 (the first-face covering layer 612a and the second-face covering layer 612b). Accordingly, the ratio of the length in the z direction between the first-face covering layer 612a, the first layer 611, and the second-face covering layer 612b is about 1:3:1.

Each of the plurality of second blocks 62 is bonded onto one of the plurality of semiconductor elements 10B. As shown in FIG. 12, each second block 62 is bonded to the corresponding semiconductor element 10B via a block bonding material 620. The component material of the block bonding material 620 is, for example, solder. Note that the component material is not limited to solder, and may alternatively be a conductive bonding material such as silver paste or sintered metal. The block bonding material 620 is interposed between each second block 62 and the corresponding semiconductor element 10B. Each second block 62 opposes the element obverse face 101 of the corresponding semiconductor element 10B. The length in the z direction of each second block 62 is not specifically limited, but is, for example, about 1.83 mm in the present embodiment. In the present embodiment, each second block 62 is a columnar body and has a substantially rectangular shape in a plan view, as shown in FIGS. 4, 10, and 12. Note that the shape of each second block 62 in a plan view is not limited thereto, and may alternatively be a circular shape, an elliptical shape, or a polygonal shape.

As shown in FIG. 12, each second block 62 includes a first layer 621 and a pair of second layers 622. The first layer 621 has a first face 621a and a second face 621b. The first face 621a faces in the z2 direction. The second face 621b faces in the z1 direction. The pair of second layers 622 includes a first-face covering layer 622a and a second-face covering layer 622b. The first-face covering layer 622a covers the first face 621a. The second-face covering layer 622b covers the second face 621b. Accordingly, the first layer 621 is sandwiched by the first-face covering layer 622a and the second-face covering layer 622b, i.e., the two second layers 622. Note that the configuration of each second block 62 is not limited thereto, and the second block 62 may alternatively be constituted solely by the first layer 621. That is to say, each second block 62 may be composed of a single material, rather than being a laminated material.

In each second block 62, the component materials of the first layer 621 and the second layers 622 are the same as those of the first layer 611 and the second layers 612 of each first block 61. Accordingly, in the present embodiment, the component material of each second block 62 is CIC. Note that the component material of the first blocks 61 may differ from the component material of the second blocks 62. In each second block 62, the length in the z direction of the first layer 621 is about three times the length in the z direction of each of the second layers 622 (each of the first-face covering layer 622a and the second-face covering layer 622b), similarly to each first block 61. Accordingly, the ratio of the length in the z direction between the first-face covering layer 622a, the first layer 621, and the second-face covering layer 622b is about 1:3:1.

The length in the z direction of each first block 61 is smaller than the length in the z direction of each second block 62. In the present embodiment, since the length in the z direction of each second block 62 is about 1.83 mm as mentioned above, the length in the z direction of each first block 61 is smaller than this value. With this configuration, the extending portions 321b of the input terminal 32 can be arranged above the lead members 40.

As shown in FIGS. 4 and 10, the sealing resin 70 covers the plurality of semiconductor elements 10, a portion of the support substrate 20, a portion of each of the plurality of terminals 30, the plurality of lead members 40, the plurality of wire members 50. and the plurality of conductive blocks 60. The component material of the sealing resin 70 is epoxy resin, for example. As shown in FIGS. 1, 3, and 6 to 10, the sealing resin 70 has a resin obverse face 71, a resin reverse face 72, and a plurality of resin side faces 731 to 734.

As shown in FIGS. 6 and 8 to 10, the resin obverse face 71 and the resin reverse face 72 are spaced apart from each other in the z direction, and faces toward opposite sides. The resin obverse face 71 faces in the z2 direction, and the resin reverse face 72 faces in the z1 direction. As shown in FIG. 7, the resin reverse face 72 has a frame shape that surrounds the reverse face 212A of the insulating substrate 21A and the reverse face 212B of the insulating substrate 21B in a plan view. Thus, the reverse faces 212A and 212B are exposed from the resin reverse face 72. As shown in FIGS. 3 and 6 to 10, each of the plurality of resin side faces 731 to 734 are continuous with both the resin obverse face 71 and the resin reverse face 72, and are sandwiched by the resin obverse face 71 and the resin reverse face 72 in the z direction. In the present embodiment, the resin side faces 731 and 732 are spaced apart from each other in the x direction, and face toward opposite sides. The resin side face 731 faces in the x1 direction, and the resin side face 732 faces in the x2 direction. The resin side faces 733 and 734 are spaced apart from each other in the y direction, and face toward opposite sides. The resin side face 733 faces in the y1 direction, and the resin side face 734 faces in the y2 direction.

Next, the details of the weld portions M1 to M5 will be described.

In the present embodiment, the plurality of weld portions M1 to M5 are formed by laser welding, as mentioned above. The laser beam used in this laser welding is a YAG laser with a basic wavelength, for example. The laser beam used is not limited thereto, but may alternatively be a second-harmonic YAG laser, a YLF laser, a $YVO_4$ laser, a KrF laser, a $CO_2$ laser, a CO laser, or the like. In the laser welding of the present embodiment, a laser beam is applied while being tilted about 5 to 15° with respect to the z direction. For example, when each weld portion M4 is formed, a laser beam is applied while being tilted in the x2 direction with respect to the z direction, as indicated by a thick black arrow in FIG. 11. In the following description, the direction in which the laser beam is tilted with respect to the z direction is referred to as a "tilting direction". Note that the tilting direction of the laser beam during laser welding for the weld portions M1 to M5 is not specifically limited, but at least when each weld portion M5 shown in FIG. 12 is formed, the laser beam is applied while being tilted in the x2 direction with respect to the z direction.

The method of forming each weld portion M1 is as follows. That is to say, the laser beam is applied from the pad portion 311 side with the pad portion 311 of the input terminal 31 and the spacer 26A overlapped with each other in the z direction. Thus, the pad portion 311 is melted at a portion to which the laser beam is applied, by the energy thereof. After the pad portion 311 is melted to penetrate in the z direction, subsequently, the spacer 26A melts. Thereafter, when the application of the laser beam is stopped, the melted portion solidifies, and the weld portion M1, at which a portion of the pad portion 311 and a portion of the spacer 26A are welded to each other, is formed.

The weld portions M2 to M5 are also formed similarly to the weld portions m1. When each weld portion M2 is formed, a laser beam is applied from the extending portion 321b side with the extending portion 321b of the input terminal 32 and the second block 62 overlapped with each other in the z direction. Thus, the weld portion M2, at which a portion of the extending portion 321b and the second block 62 are welded to each other, is formed. When each weld portion M3 is formed, a laser beam is applied from the pad portion 331 side with the pad portion 331 of the output terminal 33 and the spacer 26B overlapped with each other in the z direction. Thus, the weld portion M3, at which a portion of the pad portion 331 and the spacer 26B are welded to each other, is formed. When each weld portion M4 is formed, a laser beam is applied from the first bonding portion 41 side with the first bonding portion 41 of the lead member 40 and the first block 61 overlapped with each other in the z direction. Thus, the weld portion M4, at which a portion of the first bonding portion 41 and a portion of the first block 61 are welded to each other, is formed. When each weld portion M5 is formed, a laser beam is applied from the second bonding portion 42 side with the second bonding portion 42 of the lead member 40 and the conductive substrate 22B overlapped with each other in the z direction. Thus, the weld portion M5, at which a portion of the second bonding portion 42 and a portion of the conductive substrate 22B are welded to each other, is formed. Note that the plurality of weld portions M4 and M5 are formed before the plurality of weld portions M1 to M3 are formed.

In the present embodiment, the weld portions M1 to M5 have a circular shape in a plan view, as shown in FIG. 4. As shown in FIG. 10, each of the weld portions M1 to M5 have a substantially conical shape. The weld portions M1 to M5 have an uneven face that faces in the z2 direction. When the weld portions M1 to M5 are formed, the laser beam application conditions at the time of laser welding are substantially the same. Note that the laser beam application conditions include the type of laser beam, the application time, the laser beam output, the beam diameter, the application trajectory of the laser beam, and so on.

In the present embodiment, each weld portion M4 includes an upper face m41 and a lower end face m42, as shown in FIG. 11.

The upper face m41 faces in the z2 direction. The upper face m41 has a circular shape in a plan view. In the present embodiment, the upper face m41 has a diameter of about 1 mm, for example. The upper face m41 is formed unevenly. In the upper face m41, a center portion m411 is recessed with respect to a face of the first bonding portion 41 of the lead member 40 that faces in the z2 direction. A peripheral portion m412 is raised with respect to the face of the first bonding portion 41 of the lead member 40 that faces in the z2 direction. The peripheral portion m412 forms a substantially annular shape in a plan view.

The lower end portion m42 is an end portion of the weld portion M4 on the side in the z1 direction. In the cross-sectional view shown in FIG. 11, a line connecting the center portion m411 to the lower end portion m42 tilts with respect to the z direction. In a plan view, the lower end portion m42 is located on the side opposite to the side on which the laser beam tilts, with respect to the center portion m411 of the upper face m41. Accordingly, the aforementioned line connecting the center portion m411 to the lower end portion m42 tilts in the same direction as the tilting direction of the laser beam with respect to the z direction. In the z direction, the lower end portion m42 is located between the first face 611a and the second face 611b of the first layer 611 of the first block 61. Accordingly, each weld portion M4 reaches the first layer 611 from the first-face covering layer 612a of the first block 61. In the present embodiment, assuming that the length in the z direction of the first layer 611 of the first block 61 is denoted as t1, and the length in the z direction of a portion of the weld portion M4 that comes into contact with the first layer 611 is denoted as t2, the laser beam application conditions are adjusted such that the length t2 is 20 to 80% (50±30%) of the length t1, as shown in FIG. 11.

In the present embodiment, each weld portion M2 includes an upper face m21 and a lower end face m22, as shown in FIG. 12.

The upper face m21 faces in the z2 direction. The upper face m21 has a circular shape in a plan view. In the present embodiment, the upper face m21 has a diameter of about 1 mm, for example. The upper face m21 is formed unevenly. In the upper face m21, a center portion m211 is recessed with respect to a face of the extending portion 321b of the input terminal 32 that faces in the z2 direction. The peripheral portion m212 is raised with respect to the face of the extending portion 321b of the input terminal 32 that faces in the z2 direction. The peripheral portion m212 forms a substantially annular shape in a plan view.

The lower end portion m22 is an end portion of the weld portion M2 on the side in the z1 direction. In the cross-sectional view shown in FIG. 12, a line connecting the center portion m211 to the lower end portion m22 tilts with respect to the z direction. In a plan view, the lower end portion m22 is located on a side opposite to the side on which the laser beam tilts, with respect to the center portion m211 of the upper face m21. Accordingly, the aforementioned line connecting the center portion m211 to the lower end portion m22 tilts in the same direction as the tilting direction of the laser beam with respect to the z direction. In the z direction, the lower end portion m22 is located between the first face 621a and the second face 621b of the first layer 621 of the second block 62. Accordingly, each weld portion M2 reaches the first layer 621 from the first-face covering layer 622a of the second block 62. In the present embodiment, assuming that the length in the z direction of the first layer 621 of the second block 62 is denoted as t3, and the length in the z direction of a portion of the weld portion M2 that comes into contact with the first layer 621 is denoted as t4, the laser beam application conditions are adjusted such that the length t4 is 20 to 80% (50±30%) of the length t3, as shown in FIG. 12.

Next, the effects of the semiconductor device A1 according to the first embodiment will be described.

According to the semiconductor device A1, the first blocks 61 (conductive blocks 60) and the lead members 40 are provided. The first blocks 61 are bonded to the semiconductor elements 10A via the block bonding materials 610. The thermal expansion coefficient of the first blocks 61 is smaller than the thermal expansion coefficient of the lead members 40. The lead members 40 are bonded to the first blocks 61 by laser welding, and are electrically connected to the semiconductor elements 10A via the first blocks 61. Each first block 61 and the corresponding lead member 40 are bonded to each other by the weld portion M4 at which a portion of the first block 61 and a portion of the lead member 40 are welded to each other. According to this configuration, the difference between the thermal expansion coefficient of the semiconductor elements 10A and the thermal expansion coefficient of the first blocks 61 can be reduced, and thus, thermal stress applied to the block bonding materials 610 can be mitigated. With this configuration, fatigue failure and peeling of the block bonding materials 610 can be suppressed. Furthermore, the lead members 40 and the first blocks 61 are bonded to each other by laser welding. Bonding by laser welding makes it possible to achieve a higher bonding strength than bonding by means of a conductive bonding material. For this reason, the effect of thermal stress caused by the difference between the thermal expansion coefficient of the lead members 40 and the thermal expansion coefficient of the first blocks 61 is small. Accordingly, there is less chance of peeling, cracking, or the like occurring at the portions at which the lead members 40 and the first blocks 61 are bonded to each other. As a result of the above, with the semiconductor device A1, the thermal cycle resistance can be improved.

According to the semiconductor device A1, the second blocks 62 (conductive blocks 60) and the input terminal 32 are provided. The second blocks 62 are bonded to the semiconductor elements 10B via the block bonding materials 620. The thermal expansion coefficient of the second blocks 62 is smaller than the thermal expansion coefficient of the input terminal 32. The input terminal 32 includes the extending portions 321*b*. The extending portions 321*b* are bonded to the second blocks 62 by laser welding, and are electrically connected to the semiconductor elements 10B via the second blocks 62. Each second block 62 and the corresponding extending portion 321*b* are bonded to each other by the weld portions M2 at which a portion of the second block 62 and a portion of the extending portion 321*b* are welded to each other. According to this configuration, the difference between the thermal expansion coefficient of the semiconductor elements 10B and the thermal expansion coefficient of the second blocks 62 can be reduced, and thus, thermal stress applied to the block bonding materials 620 can be mitigated. With this configuration, fatigue failure and peeling of the block bonding materials 620 can be suppressed. Furthermore, the input terminal 32 (extending portions 321*b*) and the second blocks 62 are bonded to each other by laser welding. Bonding by laser welding makes it possible to achieve a higher bonding strength than bonding by means of a conductive bonding material. For this reason, the effect of the thermal stress caused by the difference between the thermal expansion coefficient of the input terminal 32 (extending portions 321*b*) and the thermal expansion coefficient of the second blocks is small. Accordingly, there is less chance of peeling, cracking, or the like at the portions at which the extending portions 321*b* of the input terminal 32 and the second blocks 62 are bonded to each other. As a result of the above, with the semiconductor device A1, the thermal cycle resistance can be improved.

According to the semiconductor device A1, the component material of the first blocks 61 (conductive blocks 60) is CIC. That is to say, each first block 61 has a structure in which the first layer 611, which is composed of an alloy such as Inver, and a pair of second layers 612, which sandwich the first layer 611 and are composed of copper, are laminated. Copper has a low YAG laser absorptivity, and alloys such as Invar have a higher YAG laser absorptivity than copper. For example, the YAG laser absorptivity of Inver is about 22%, while the YAG laser absorptivity of copper is about 6%. According to this configuration, when a laser beam is applied to the first bonding portion 41 of each lead member 40, the lead member 40, the first-face covering layer 612*a* of the corresponding first block 61, and the first layer 611 of the first block 61 sequentially melt due to the application of the laser beam. Then, the laser beam absorptivity sharply decreases at an interface between the first layer 611 and the second-face covering layer 612*b*, and therefore, the second-face covering layer 612*b* is unlikely to melt. As a result, it is possible to keep the portion melted by the laser beam from penetrating the first block 61 and reaching the corresponding semiconductor element 10A. That is to say, destruction of the semiconductor elements 10A can be suppressed. Note that, in the present embodiment, the component material of the lead members 40 and the first-face covering layer 612*a* is also copper and has low laser beam absorptivity, but the lead members 40 and the first-face covering layer 612*a* are appropriately melted due to high energy of the laser beam since the lead member 40 and the first-face covering layer 612*a* are close to a portion at which the laser beam is applied.

Furthermore, even in the case where each first block 61 does not include the first-face covering layer 612*a* and is constituted by a laminated material of the first layer 611 and the second-face covering layer 612*b*, the aforementioned destruction of the semiconductor element 10A can be suppressed. However, in the case where each first block 61 is constituted by a laminated material of the first layer 611 and the second-face covering layer 612*b*, warping may occur due to the difference in thermal expansion coefficient therebetween, and it is therefore preferable that each first block 61 is constituted by a laminated material of the first layer 611 and a pair of second layers 612.

According to the semiconductor device A1, the component material of the second blocks 62 (conductive blocks 60) is CIC. That is to say, each second block 62 has a structure in which the first layer 621, which is composed of an alloy such as Inver, and a pair of second layers 622, which sandwich the first layer 621 and are composed of copper, are laminated. With this configuration, it is possible to keep a portion melted by the laser beam from penetrating the second block 62 and reaching the corresponding semiconductor element 10B, as with the aforementioned first blocks 61. That is, destruction of the semiconductor element 10B can be suppressed.

According to the semiconductor device A1, the weld portions M5 are formed at the portions at which the second bonding portions 42 of the lead members 40 and the conductive substrate 22B are bonded to each other. That is to say, the lead members 40 are bonded to the conductive substrate 22B by laser welding. In the case where the lead members 40 and the conductive substrate 22B are bonded to each other via conductive bonding materials, for example, it is necessary to heat the conductive bonding materials at a temperature of about 250 to 350° C. for several to several tens of minutes to melt it, and thereafter cool and solidify the conductive bonding materials. Meanwhile, in the case of performing laser welding as in the present embodiment, laser welding need only be performed for only several milliseconds to several tens of milliseconds per location. Accordingly, the lead members 40 and the conductive substrate 22B can be bonded to each other in a shorter time than in the case of bonding the lead members 40 and the conductive substrate 22B via the conductive bonding materials. As a result, the manufacturing efficiency of the semiconductor device A1 can be improved.

According to the semiconductor device A1, the weld portions M1 are formed at the portions at which the input terminal 31 and the spacer 26A are bonded to each other. That is to say, the input terminal 31 is bonded to the spacer 26A by laser welding. Accordingly, the input terminal 31 and the spacer 26A can be bonded to each other in a shorter time than in the case of bonding the input terminal 31 and the spacer 26A via a conductive bonding material. In addition, since the input terminal 31 is bonded to the spacer 26A by laser welding, aluminum, which is difficult to be bonded using a conductive bonding material such as solder or sintered metal, can be used as a component material of the input terminal 31.

According to the semiconductor device A1, the weld portions M3 are formed at the portions at which the output terminal 33 and the spacer 26B are bonded to each other. That is to say, the output terminal 33 is bonded to the spacer 26B by laser welding. Accordingly, the output terminal 33 and the spacer 26B can be bonded to each other in a shorter time than in the case of bonding the output terminal 33 and the spacer 26B via a conductive bonding material. In addition, since the output terminal 33 is bonded to the spacer 26B by laser welding, aluminum, which is difficult to be bond using a conductive bonding material such as solder or sintered metal, can be used as a component material of the output terminal 33.

According to the semiconductor device A1, each extending portion 321b of the input terminal 32 and the corresponding lead member 40 overlap with each other in a plan view. A current flows through the extending portions 321b from the side in the x2 direction toward the side in the x1 direction. A current flows through the lead members 40 from the side in the x1 direction toward the side in the x2 direction. That is to say, currents flow through the extending portions 321b and the lead members 40 in opposite directions of the x direction. Accordingly, in the semiconductor device A1, the magnetic field formed by the current flowing through the extending portions 321b and the magnetic field by the current flowing through the lead members 40 can cancel each other out. Accordingly, in the semiconductor device A1, the generation of an unnecessary magnetic field can be suppressed.

According to the semiconductor device A1, each of the weld portions M1 to M5 has an uneven upper face. With this configuration, the adhesive force between the weld portions M1 to M5 and the sealing resin 70 can be increased due to the anchor effect. Accordingly, in the semiconductor device A1, peeling of the sealing resin 70 can be suppressed.

According to the semiconductor device A1, when each of the welded portions M1 to M5 is formed, a laser beam is applied while being tilted at about 5 to 15° with respect to the z direction. The lead members 40, the input terminals 31 and 32, and the output terminal 33 are composed of copper. As mentioned above, copper has low laser beam absorptivity and reflects the laser beam. For this reason, if a laser beam is vertically applied to an application object, there is a possibility that the applied laser beam will be reflected toward a device applying the laser beam (laser beam application device) and damage the laser beam application device. In contrast, in the present embodiment, the laser beam is applied while being tilted with respect to the application object, and it is thus possible to suppress reflection of the applied laser beam toward the laser beam application device. Accordingly, during laser welding, damage to the laser beam application device can be suppressed.

According to the semiconductor device A1, the conductive substrates 22A and 22B are composite substrates each of which includes the graphite substrate 220m and the copper films 220n formed on the respective faces in the z direction of the graphite substrate 220m. The graphite substrate 220m has a high thermal conductivity in a direction orthogonal to a predetermined surface. Accordingly, heat from the semiconductor elements 10 can be efficiently diffused by arranging the graphite substrates 220m such that the thermal conductivity in the z direction is high.

In the first embodiment, the lead members 40 are made of copper or a copper alloy, but the component material of the lead members 40 is not limited thereto and may alternatively be an alloy such as Inver, Super-Inver, Kovar, or a CuMo sintered compact. In this case, the thermal expansion coefficient is low, and thus the thermal stress can be reduced. However, these alloys have a larger electrical resistance than that of copper. Accordingly, in a semiconductor device in which a large current flows (power module), it is preferable that the lead members 40 are made of copper or a copper alloy. In addition, using laminated materials made of CIC or the like as the lead members 40 can reduce the thermal expansion coefficient and suppress the electrical resistance, but increases the cost. For this reason, from the viewpoint of suppressing an increase in the manufacturing cost, it is preferable that the lead members 40 are made of copper or a copper alloy. From the above, since the semiconductor device A1 includes the conductive blocks 60, the thermal cycle resistance can be improved while using copper or a copper alloy as the component material of the lead members 40, and thus, it is possible to further suppress an increase in the manufacturing cost of the semiconductor device A1 and reduce the resistance.

Figure 13:
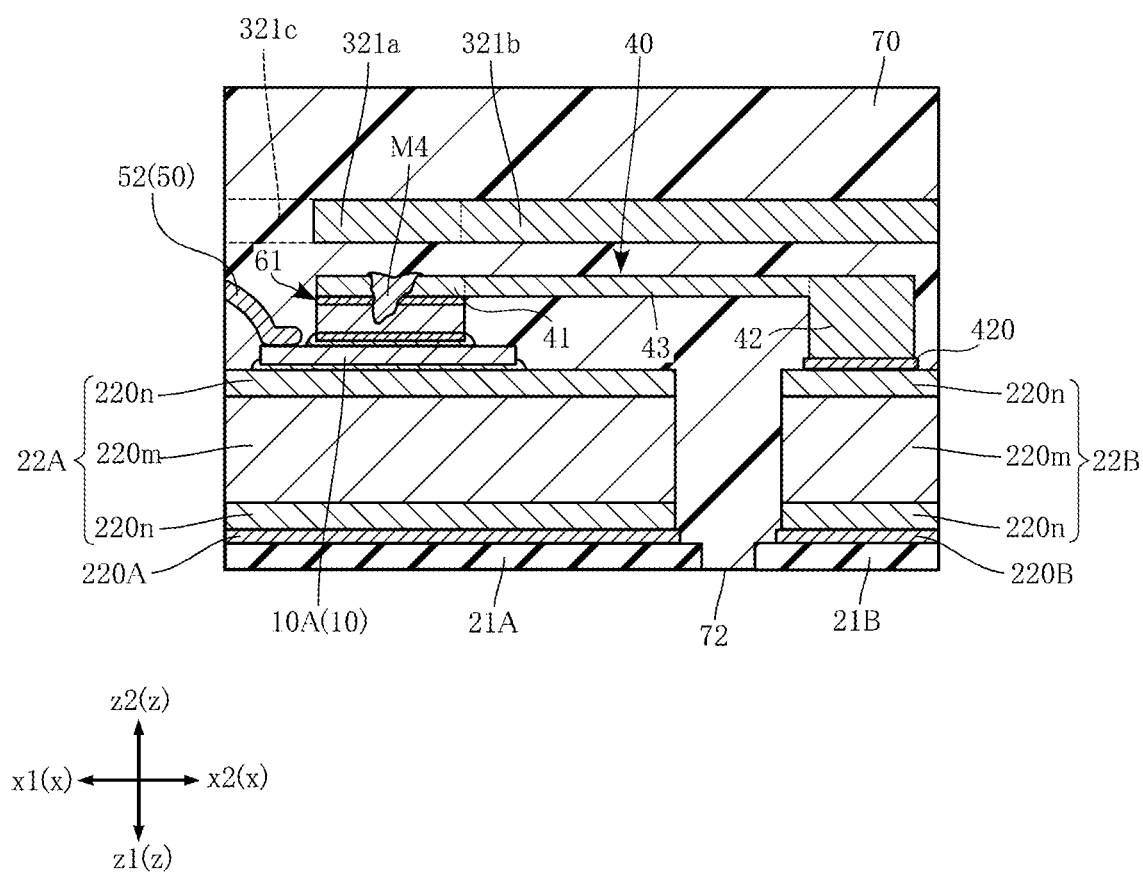
FIG. 13 is a partially enlarged cross-sectional view showing a semiconductor device according to a variation of the first embodiment.

Although the first embodiment described the case where the connecting portion 43 of each lead member 40 is bent in the z direction, the present invention is not limited thereto. For example, in each lead member 40, the length in the z direction of the second bonding portion 42 may be larger than the length in the z direction of the first bonding portion 41, as shown in FIG. 13. FIG. 13 is a partially enlarged view in which a portion of a cross-section corresponding to FIG. 10 is enlarged. In this case, faces of the first bonding portion 41, the second bonding portion 42, and the connecting portion 43 that face in the z direction are flush with each other. Although the example in FIG. 13 shows the case where the second bonding portion 42 is bonded to the conductive substrate 22B by the conductive bonding material 420 such as solder or sintered metal, the second bonding portion 42 may alternatively be bonded by laser welding, as in the first embodiment.

Figure 14:
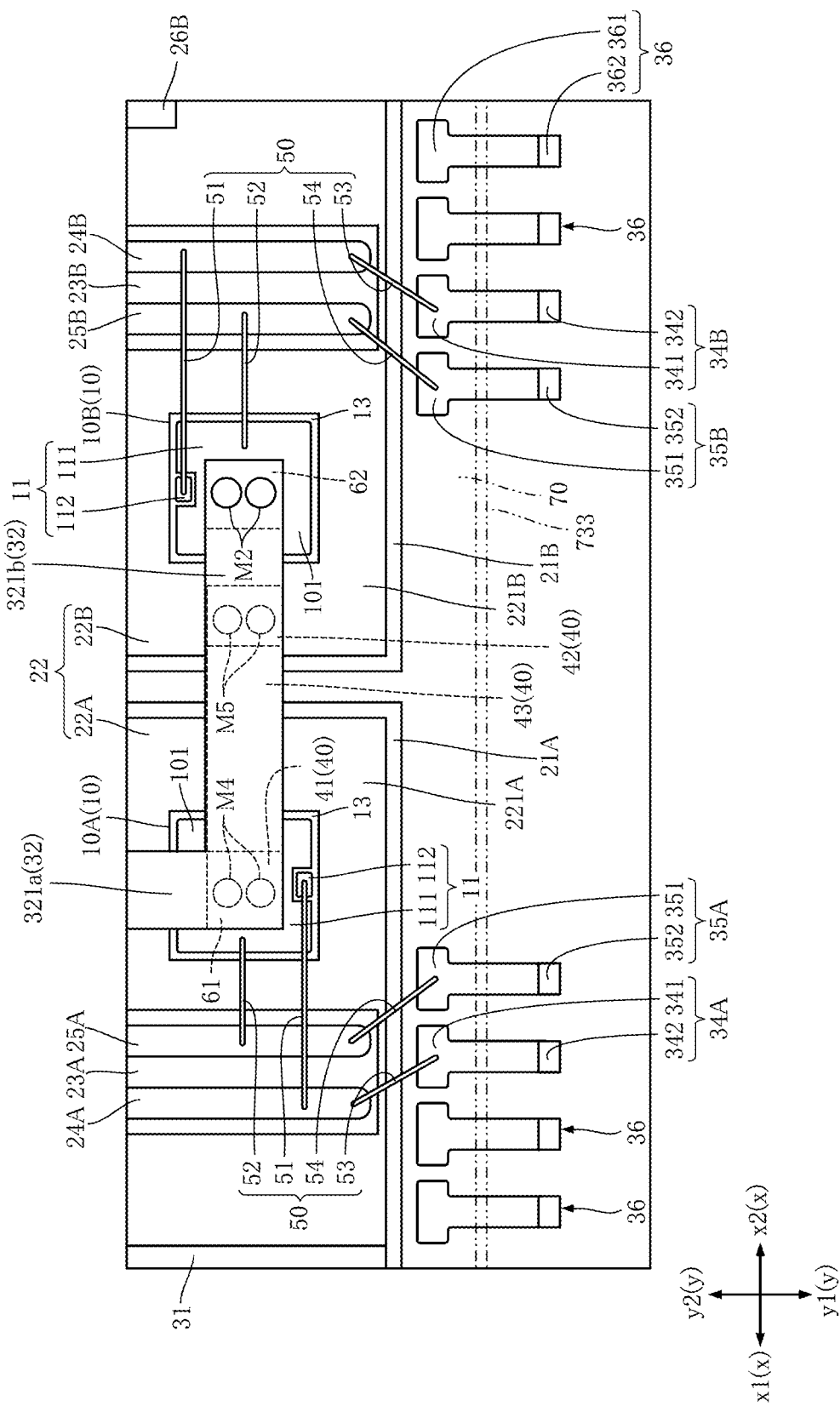
FIG. 14 is a partially enlarged plan view showing a semiconductor device according to a variation of the first embodiment.

Although the first embodiment described the case where each extending portion 321b of the input terminal 32 is bonded to the corresponding first block 61 by one weld portion M2, the present invention is not limited thereto. For example, each extending portion 321b may be bonded to the first block 61 by a plurality of (two in FIG. 14) weld portions M2 as shown in FIG. 14, depending on the size (the length in the x direction and the length in the y direction) of the extending portion 321b or the length of each weld portion M2 in a plan view. FIG. 14 is a diagram corresponding to FIG. 5 of the first embodiment. By thus forming a plurality of weld portions M2, each extending portion 321b can be kept from moving due to rotational stress that is applied along a plane (x-y plane) orthogonal to the z direction. Furthermore, by forming a plurality of weld portions M2, conduction resistance at the portion at which each extending portion 321b and the corresponding first block 61 are bonded to each other can be reduced. Although FIG. 14 shows the case where the plurality of weld portions M2 are arranged in a line in the y direction in a plan view, the present invention is not limited thereto. The plurality of weld portions M2 may be arranged in a line in the x direction, or may be arranged in a grid pattern.

Although the first embodiment described the case where the first bonding portion 41 of each lead member 40 is bonded to the corresponding second block 62 by one weld portion M4, the present invention is not limited thereto. For example, each first bonding portion 41 may be bonded to the second block 62 by a plurality of (two in FIG. 14) weld portions M4 as shown in FIG. 14, depending on the size (the length in the x direction and the length in the y direction) of each lead member 40 or the length of each weld portion M4 in a plan view. By thus forming a plurality of weld portions M4, each lead member 40 can be suppressed from moving due to rotational stress that is applied along an x-y plane. Furthermore, by forming a plurality of weld portions M4, conduction resistance at the portion at which each first bonding portion 41 and the corresponding second block 62 are bonded to each other can be reduced. Although FIG. 14 shows the case where the plurality of weld portions M4 are arranged in a line in the y direction in a plan view, the present invention is not limited thereto. The plurality of weld portions M4 may be arranged in a line in the x direction, or may be arranged in a grid pattern.

Although the first embodiment described the case where the second bonding portion 42 of each lead member 40 is bonded to the conductive substrate 22B by one weld portion M5, the present invention is not limited thereto. For example, each second bonding portion 42 may be bonded to the conductive substrate 22B by a plurality of (two in FIG. 14) weld portions M5 as shown in FIG. 14, depending on the size (the length in the x direction and the length in the y direction) of each lead member 40 or the length of each weld portion M4 in a plan view. By thus forming a plurality of weld portions M5, each lead member 40 can be suppressed from moving due to rotational stress that is applied along an x-y plane. Furthermore, by forming a plurality of weld portions M5, conduction resistance at the portion at which each second bonding portion 42 and the conductive substrate 22B are bonded to each other can be reduced. Although FIG. 14 shows the case where the plurality of weld portions M5 are arranged in a line in the y direction in a plan view, the present invention is not limited thereto. The plurality of weld portions M5 may be arranged in a line in the x direction, or may be arranged in a grid pattern.

Although the first embodiment described the case where substantially the same laser beam application conditions are employed at the time of laser welding when the plurality of weld portions M1 to M5 are formed, the present invention is not limited thereto, and different application conditions may be employed for the weld portions M1 to M5. For example, the plurality of weld portions M1, M3, and M5 may be formed with a higher-power laser beam than the laser beam used to form the plurality of weld portions M2 and M4. In this case, when the plurality of weld portions M2 and M4 are compared with the plurality of weld portions M1, M3, and M5, the plurality of weld portions M2 and M4 have a relatively small area in a plan view, and the plurality of weld portions M1, M3, and M5 have a relatively large area in a plan view. Thus, damage to the semiconductor elements 10 can be reduced during welding to the conductive blocks 60 on the semiconductor elements 10, and the bonding strength can be increased during welding to the spacers 26A and 26B or the conductive substrate 22B. In addition, by forming the plurality of weld portions M2 and M4 with a YAG laser as mentioned above, and forming the plurality of weld portions M1, M3, and M5 with a $CO_2$ laser, the area in a plan view of each of the plurality of weld portions M1, M3, and M5 can be increased and the depth (length in the z direction) thereof can be reduced compared with the plurality of weld portions M2 and M4.

Although the first embodiment described the case where the plurality of conductive blocks 60 include the plurality of first blocks 61 and the plurality of second blocks 62, the plurality of conductive blocks 60 need only include at least either the plurality of first blocks 61 or the plurality of second blocks 62. For example, if the plurality of conductive blocks 60 include the plurality of first blocks 61 and does not include the plurality of second blocks 62, fatigue failure and peeling of the block bonding materials 610 can be suppressed. In this case, the extending portions 321b of the input terminal 32 may be bonded to the semiconductor elements 10B using conductive bonding materials. For example, a portion of each extending portion 321b may be bent in the z direction, or the length in the z direction of a portion thereof that overlaps with the corresponding semiconductor element 10B in a plan view may be increased. The reverse is also true. That is to say, if the plurality of conductive blocks 60 do not include the plurality of first blocks 61 but include the plurality of second blocks 62, fatigue failure and peeling of the block bonding materials 620 can be suppressed. In this case, the first bonding portions 41 of the lead members 40 may be bonded to the semiconductor elements 10A using conductive bonding materials. For example, a configuration may be employed in which, in each lead member 40, a portion of the first bonding portion 41 or of the connecting portion 43 is bent in the z direction, or the length in the z direction of the first bonding portion 41 is increased, or the connecting portion 43 is less bent in the z direction on the side continuous with the second bonding portion 42.

Figure 15:
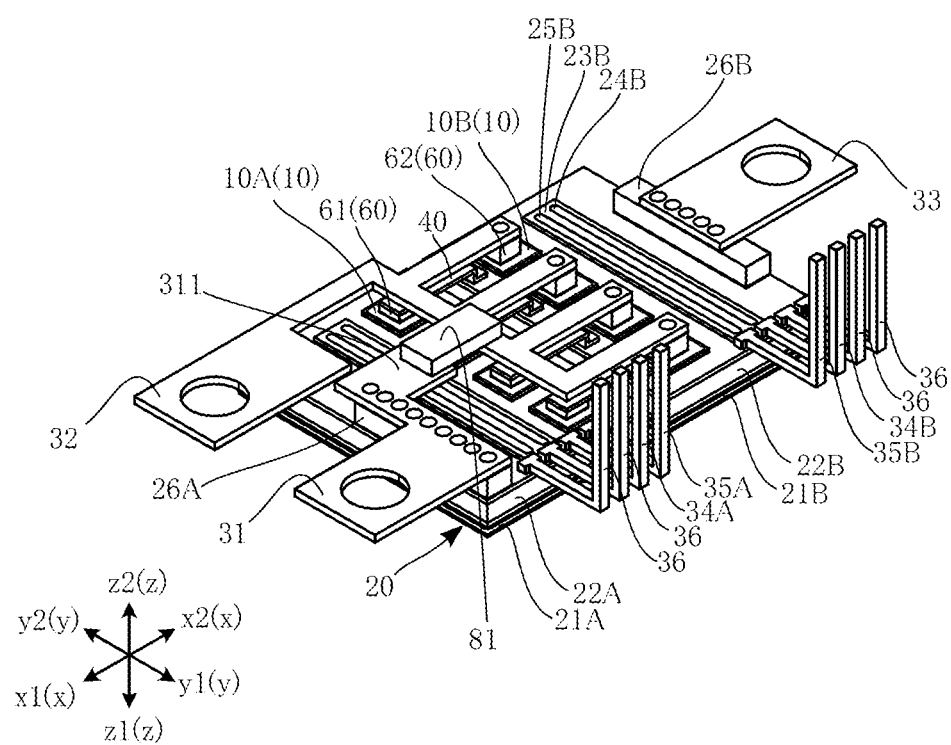
FIG. 15 is a perspective view showing a semiconductor device according to a variation of the first embodiment from which the sealing resin is omitted.
Figure 16:
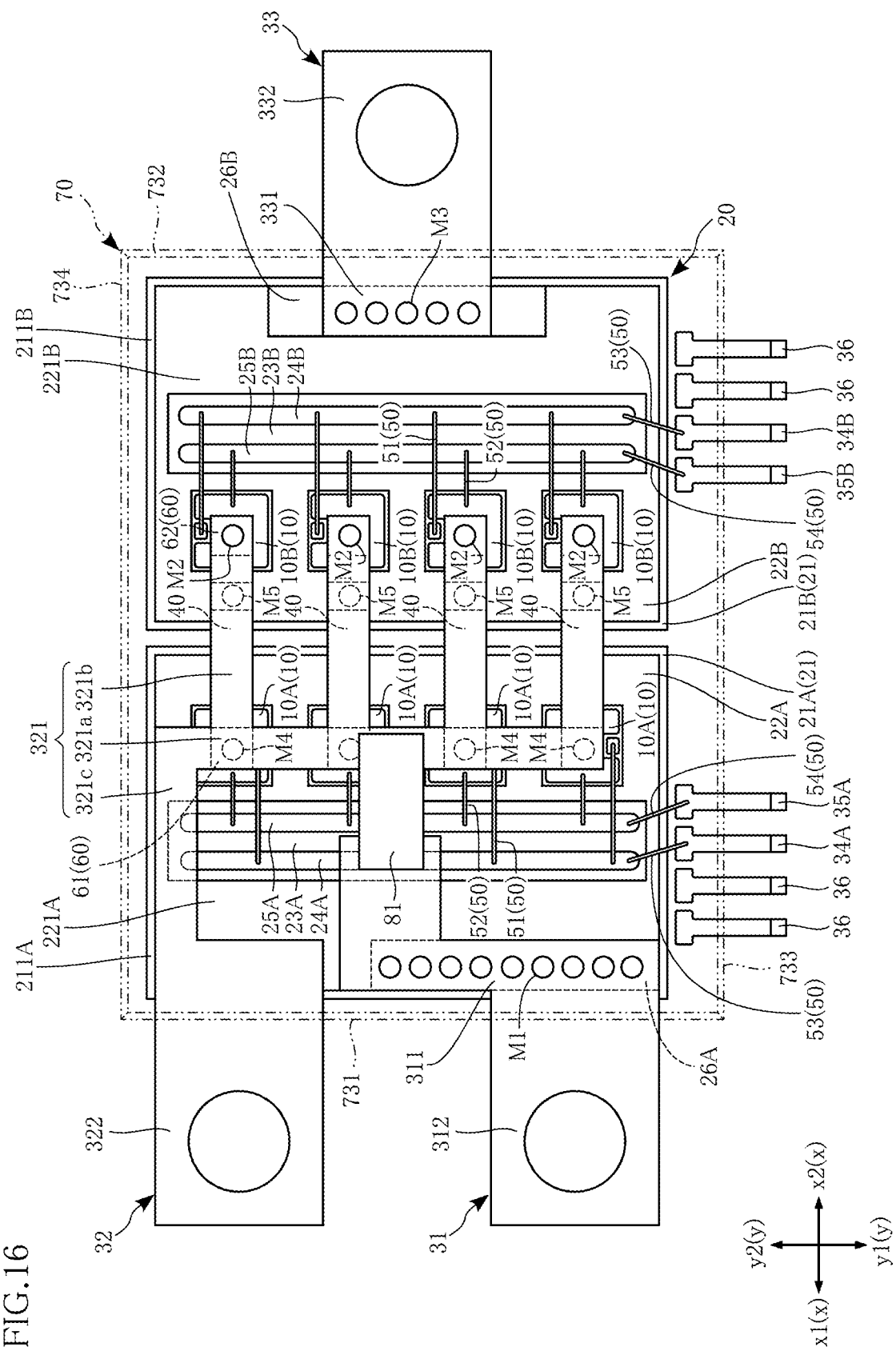
FIG. 16 is a plan view of the semiconductor device shown in FIG. 15 in which the sealing resin is indicated by imaginary lines.

In the first embodiment, a capacitor 81 may further be provided as shown in FIGS. 15 and 16. The capacitor 81 is a chip-type capacitor. One end of the capacitor 81 is placed on the pad portion 311 of the input terminal 31, and the other end is placed on the connection portion 321a of the input terminal 32. The capacitor 81 is bonded by a conductive bonding material, for example. By thus connecting the capacitor 81 to the input terminals 31 and 32, a power supply voltage (input voltage) applied between the two input terminals 31 and 32 can be stabilized. In addition, in the semiconductor device according to this variation, the capacitor 81 that stabilizes the input voltage can be incorporated into one package (sealing resin 70).

Second Embodiment

FIGS. 17 to 20 show a semiconductor device according to the second embodiment. A semiconductor device A2 of the second embodiment differs from the semiconductor device A1 mainly in the configuration of the support substrate 20, the plurality of terminals 30, and the sealing resin 70. Note that, in the second embodiment, constituent elements that are the same as or similar to those of the first embodiment are assigned the same signs, and descriptions thereof are omitted.

Figure 17:
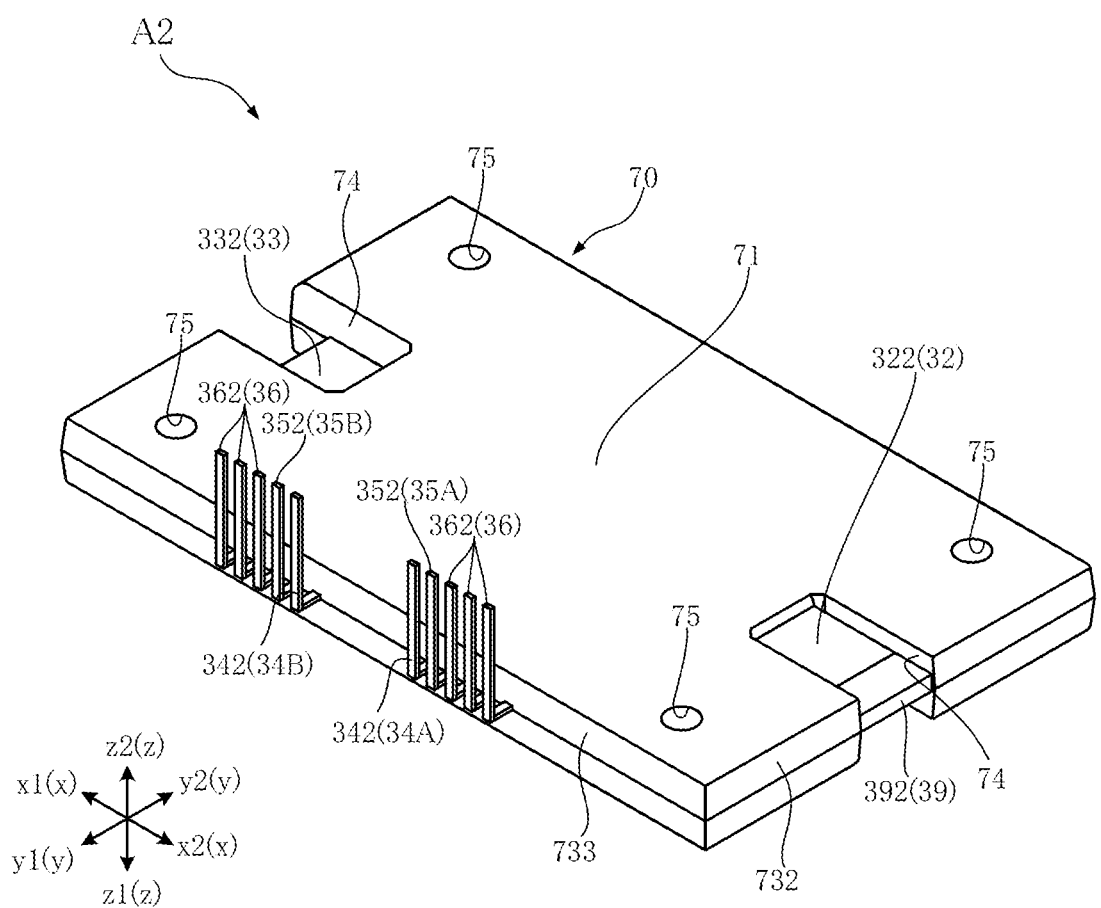
FIG. 17 is a perspective view showing a semiconductor device according to a second embodiment.
Figure 18:
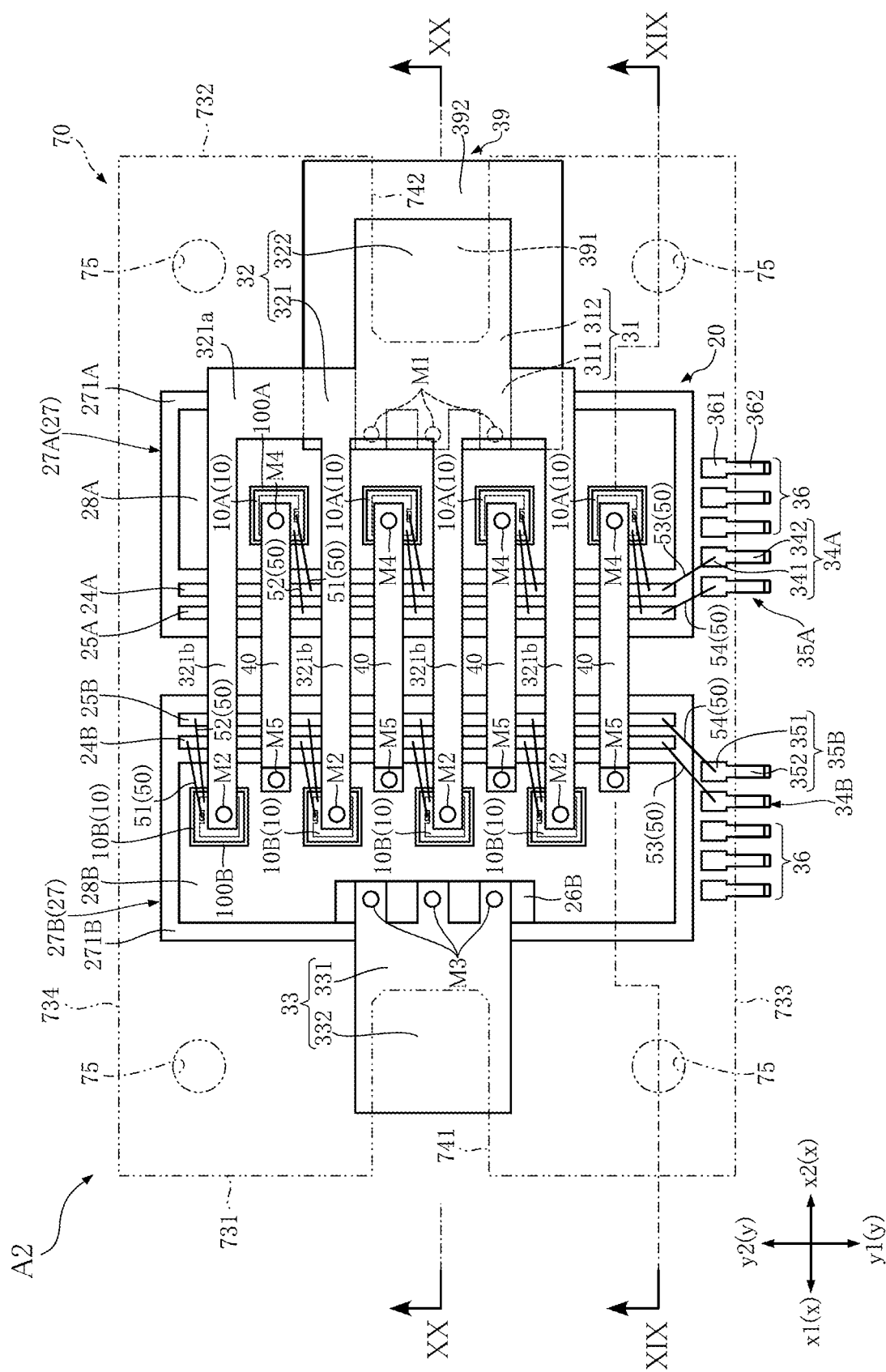
FIG. 18 is a plan view showing the semiconductor device according to the second embodiment.
Figure 19:
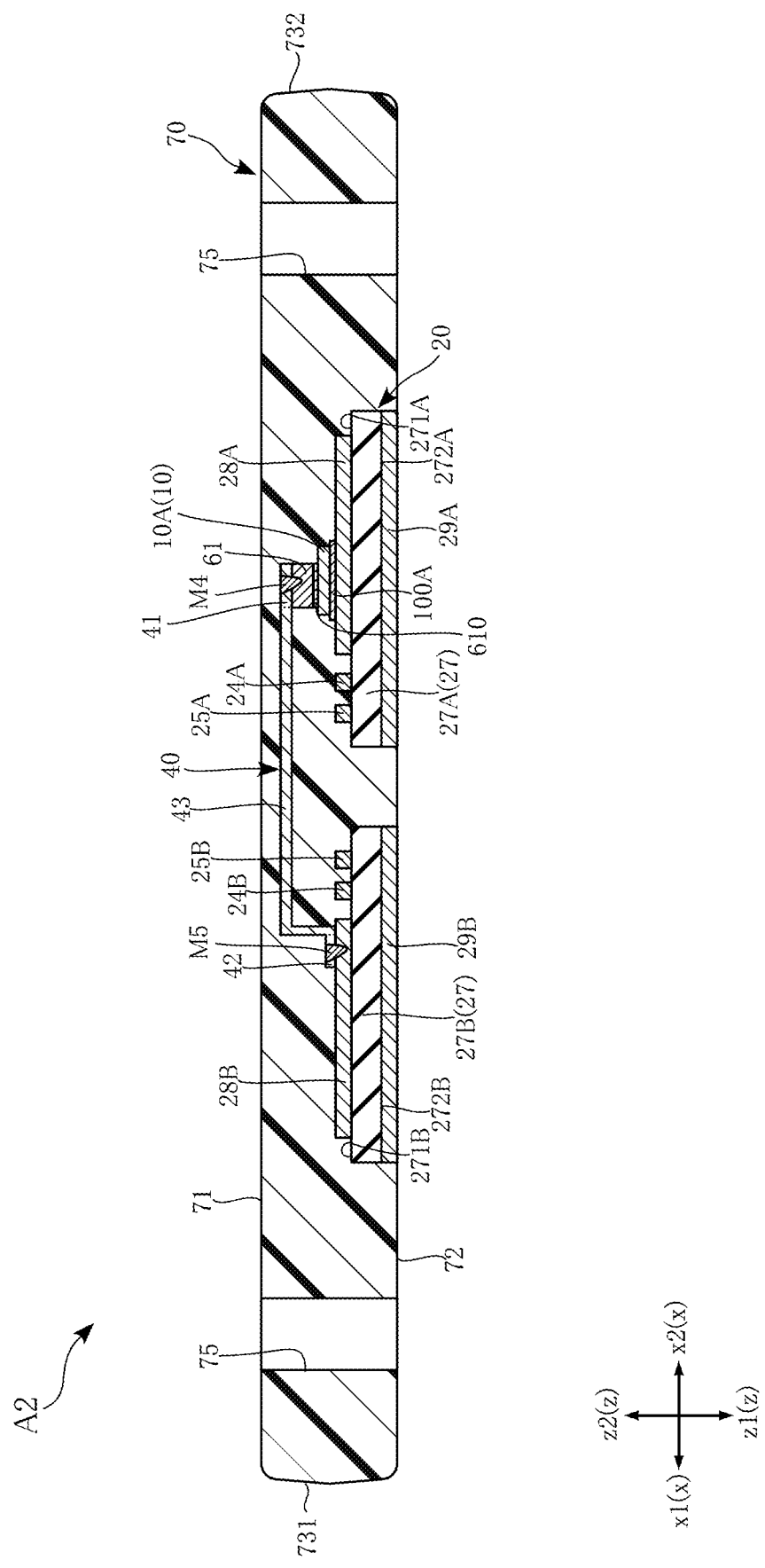
FIG. 19 is a cross-sectional view of FIG. 18 taken along a line XIX-XIX.
Figure 20:
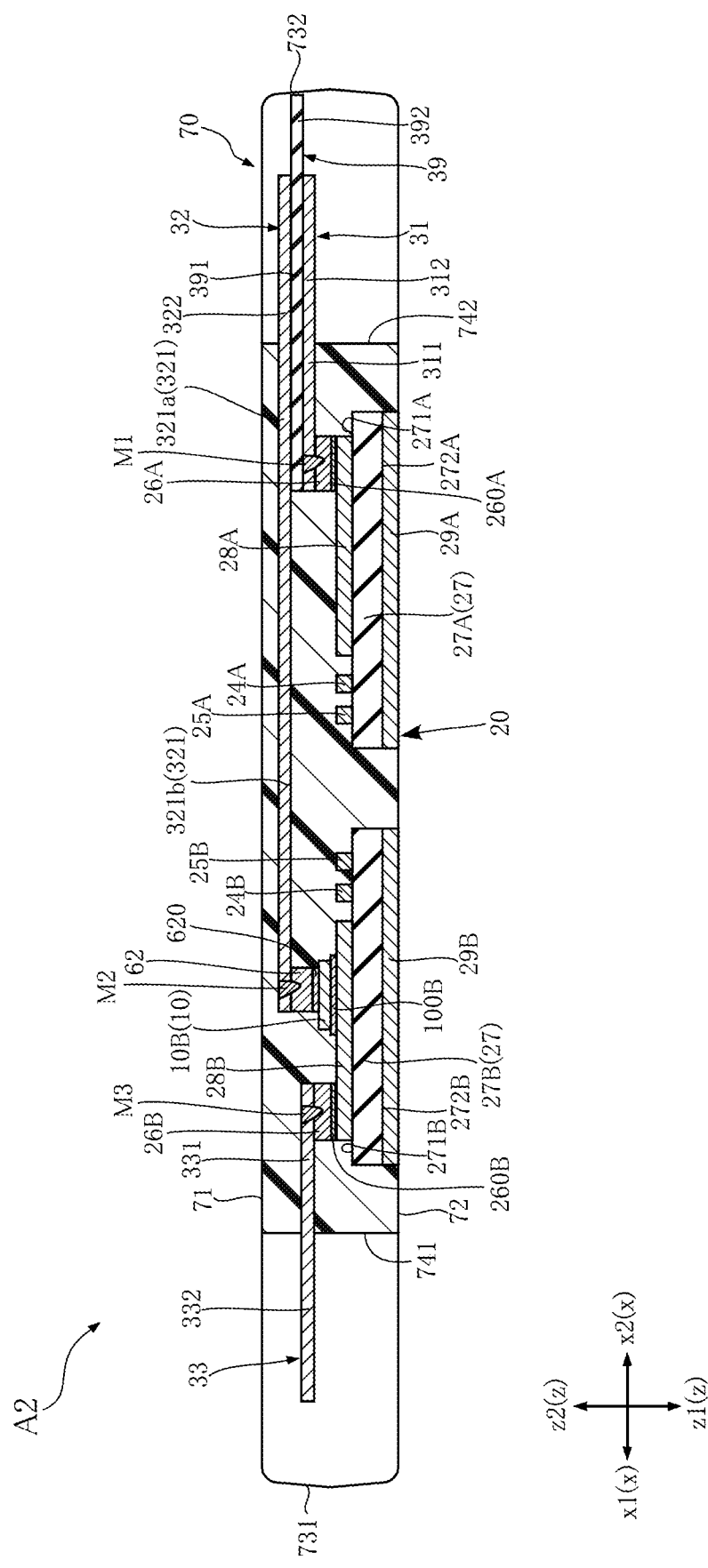
FIG. 20 is a cross-sectional view of FIG. 18 taken along a line XX-XX.

FIG. 17 is a perspective view of the semiconductor device A2. FIG. 18 is a plan view showing the semiconductor device A2 where the sealing resin 70 is indicated by imaginary lines (dash-double dot lines). FIG. 19 is a cross-sectional view of FIG. 18 taken along a line XIX-XIX. FIG. 20 is a cross-sectional view of FIG. 18 taken along a line XX-XX.

In the present embodiment, the support substrate 20 includes insulating substrates 27, two conductive layers 28A and 28B, a pair of gate layers 24A and 24B, a pair of detection layers 25A and 25B, and two reverse-face metal layers 29A and 29B, as shown in FIGS. 18 to 20.

The two conductive layers 28A and 28B, the pair of gate layers 24A and 24B, the pair of detection layers 25A and 25B, and the two reverse-face metal layers 29A and 29B are arranged on the insulating substrates 27. The insulating substrates 27 are electrically insulating plate-shaped members. In the present embodiment, the insulating substrates 27 include a pair of insulating substrates 27A and 27B, each of which has a flat plate shape. Note that the configuration of the insulating substrates 27 is not limited to the above-described one. For example, one flat-plate insulating substrate 27 may be employed, rather than two divided insulating substrates 27A and 27B. The component material of the insulating substrates 27A and 27B are the same as that of the insulating substrates 21. Accordingly, the component material of these insulating substrates is a ceramic with excellent thermal conductivity, such as AlN, SiN, or $Al_2O_3$.

Each of the insulating substrates 27A and 27B has a rectangular shape in a plan view. The insulating substrate 27A supports the conductive layer 28A, the gate layer 24A, the detection layer 25A, and the reverse-face metal layer 29A. The insulating substrate 27B supports the conductive layer 28B, the gate layer 24B, the detection layer 25B, and the reverse-face metal layer 29B. The insulating substrates 27A and 27B are spaced apart from each other. In the present embodiment, the insulating substrates 27A and 27B are spaced apart from each other and arranged in a line in the x direction, as shown in FIGS. 18 to 20.

As shown in FIGS. 19 and 20, the insulating substrate 27A has an obverse-face 271A and a reverse face 272A. The obverse face 271A and the reverse face 272A are spaced apart from each other and face in opposite directions in the z direction. The obverse face 271A faces in the z2 direction, and the reverse face 272A faces in the z1 direction. The obverse face 271A opposes the conductive layer 28A, the gate layer 24A, and the detection layer 25A, and the reverse face 272A opposes the reverse-face metal layer 29A.

As shown in FIGS. 19 and 20, the insulating substrate 27B has an obverse-face 271B and a reverse face 272B. The obverse face 271B and the reverse face 272B are spaced apart from each other and face in opposite directions in the z direction. The obverse face 271B faces in the z2 direction, and the reverse face 272B faces in the z1 direction. The obverse face 271B opposes the conductive layer 28B, the gate layer 24B, and the detection layer 25B, and the reverse face 272B opposes the reverse-face metal layer 29B.

The two conductive layers 28A and 28B constitute conductive paths to the plurality of semiconductor elements 10, together with the plurality of terminals 30. The conductive layers 28A and 28B are composed of, for example, metal foil that is made of copper or a copper alloy. Note that surfaces of the conductive layers 28A and 28B may be silver (Ag)-plated, for example.

The plurality of semiconductor elements 10A are bonded to the conductive layer 28A via the element bonding materials 100A. The conductive layer 28A has a rectangular shape in a plan view. Note that in the semiconductor device A2, the conductive layer 28A is constituted by a single region, but may alternatively be divided into a plurality of regions. The conductive layer 28A is formed on the insulating substrate 27A. In the present embodiment, the conductive layer 28A may correspond to a "first conductor" in the claims.

The plurality of semiconductor elements 10B are bonded to the conductive layer 28B via the element bonding materials 100B. The conductive layer 28B has a rectangular shape in a plan view. Note that in the semiconductor device A2, the conductive layer 28B is constituted by a single region, but may alternatively be divided into a plurality of regions. The conductive layer 28B is formed on the insulating substrate 27B. In the present embodiment, the conductive substrate 28B may correspond to a "second conductor" in the claims.

The two reverse-face metal layers 29A and 29B are composed of metal foil consisting of copper or a copper layer, for example.

The reverse-face metal layer 29A is arranged over the entire reverse face 272A of the insulating substrate 27A. The reverse-face metal layer 29A has a rectangular shape in a plan view. Note that in the semiconductor device A2, the reverse-face metal layer 29A is constituted by a single region, but may alternatively be divided into a plurality of regions. As shown in FIGS. 19 and 20, a surface (a face that faces in the z1 direction) of the reverse-face metal layer 29A is exposed from the sealing resin 70.

The reverse-face metal layer 29B is arranged over the entire reverse face 272B of the insulating substrate 27B. The reverse-face metal layer 29B has a rectangular shape in a plan view. Note that in the semiconductor device A2, the reverse-face metal layer 29B is constituted by a single region, but may alternatively be divided into a plurality of regions. As shown in FIGS. 19 and 20, a surface (a face that faces in the z1 direction) of the reverse-face metal layer 29B is exposed from the sealing resin 70.

In the support substrate 20 of the present embodiment, the gate layer 24A of is formed on the obverse face 271A of the insulating substrate 27A. The detection layer 25A is formed on the obverse face 271A of the insulating substrate 27A. As shown in FIGS. 18 to 20, the detection layer 25A, the gate layer 24A, and the conductive layer 28A are arranged in this order from the side in the x1 direction toward the side in the x2 direction on the obverse face 271A of the insulating substrate 27A. Note that this order is not limited to that shown in the diagrams.

In the support substrate 20 of the present embodiment, the gate layer 24B is formed on the obverse face 271B of the insulating substrate 27B. The detection layer 25B is formed on the obverse face 271B of the insulating substrate 27B. As shown in FIGS. 18 to 20, the detection layer 25B, the gate layer 24B, and the conductive layer 28B are arranged in this order from the side in the x2 direction toward the side in the x1 direction on the obverse face 271B of the insulating substrate 27B. Note that this order is not limited to that shown in the diagrams.

As shown in FIG. 18, the two input terminals 31 and 32, of the plurality of terminals 30, are located on the side in the x2 direction in the semiconductor device A2, and the output terminal 33 is located on the side in the x1 direction in the semiconductor device A2. A portion of the input terminal 31 and a portion of the input terminal 32 overlap with each other in a plan view and are spaced apart from each other in the z direction.

The pad portion 311 of the input terminal 31 of the present embodiment has a comb-tooth shape on the side in the x1 direction. The pad portion 311 is bonded to the spacer 26A at the portions with the comb-tooth shape. The pad portion 311 and the spacer 26A are bonded to each other by laser welding, similarly to the semiconductor device A1. Note that this bonding is not limited to laser welding, and may alternatively be solder bonding, ultrasonic bonding, or the like. Note that the semiconductor device A2 may alternatively have a configuration in which the spacer 26A is not provided, and the pad portion 311 is directly bonded to the conductive layer 28A.

In the input terminal 32 of the present embodiment, the pad portion 321 does not include the connection portion 321c, but includes a connection portion 321a and a plurality of extending portions 321b. For this reason, in the pad portion 321 of the present embodiment, the joint portion 321a is continuous with the terminal portion 322.

In the output terminal 33 of the present embodiment, the pad portion 331 has a comb-tooth shape on the side in the x2 direction. The pad portion 331 is bonded to the spacer 26B at the comb-tooth shaped portions. The pad portion 331 and the spacer 26B are bonded to each other by laser welding, similarly to the semiconductor device A1. Note that this bonding is not limited to laser welding, and may alternatively be solder bonding, ultrasonic bonding, or the like. Note that the semiconductor device A2 may alternatively have a configuration in which the spacer 26B is not provided, and the pad portion 331 is directly bonded to the conductive layer 28B.

In the present embodiment, compared with the semiconductor device A1, the semiconductor device A2 further includes an insulating material 39. As shown in FIGS. 18 and 20, the insulating material 39 is sandwiched by the input terminal 31 and the input terminal 32 in the z direction. The insulating material 39 is a flat plate. The insulating material 39 is electrically insulating, and the constituent material thereof is insulating paper, for example. In the present embodiment, the entire input terminal 31 overlaps with the insulating material 39 in a plan view. In the input terminal 32, a portion of the pad portion 321 and the entire terminal portion 322 overlap with the insulating material 39 in a plan view. When viewed in the z direction, the portions of the input terminals 31 and 32 that overlap with the insulating material 39 are in contact with the insulating material 39. The input terminals 31 and 32 are insulated from each other by the insulating material 39. Portions (on a side in the x1 direction and the two sides in the y direction) of the insulating material 39 are covered by the sealing resin 70.

As shown in FIGS. 18 and 20, the insulating material 39 has an interposing portion 391 and an extending portion 392. The interposing portion 391 is located between the terminal portion 312 of the input terminal 31 and the terminal portion 322 of the input terminal 32 in the z direction. The entire interposing portion 391 is sandwiched by the terminal portion 312 and the terminal portion 322. The extending portion 392 extends from the interposing portion 391 farther in the x2 direction than the terminal portion 312 and the terminal portion 322. Thus, the extending portion 392 is located farther on the side in the x2 direction than the terminal portion 312 and the terminal portion 322. The two sides in the y direction of the extending portion 392 are covered by the sealing resin 70.

In the present embodiment, the lead members 40 and the extending portions 321b do not overlap with each other in a plan view, but are alternately arranged in the y direction, as shown in FIG. 18. In the present embodiment, the lengths in the z direction of each first block 61 and each second block 62 are substantially the same. Therefore, the plurality of lead members 40 and the plurality of extending portions 321b overlap with each other when viewed in the y direction.

In the present embodiment, the sealing resin 70 includes a resin obverse face 71, a resin reverse face 72, resin side faces 731 to 734, two cutout portions 741 and 742, and a plurality of mounting holes 75. Thus, the sealing resin 70 of the present embodiment further has the two cutout portions 741 and 742 and the plurality of mounting holes 75.

In the present embodiment, the resin side face 731 is located farther in the x1 direction than an end edge in the x1 direction of the output terminal 33, as shown in FIG. 18. Accordingly, the sealing resin 70 extends outward, in the x1 direction, of the output terminal 33 when viewed in the y direction, as shown in FIG. 20. Furthermore, the sealing resin 732 is located farther in the x2 direction than end edges in the x2 direction of the input terminals 31 and 32, as shown in FIG. 18. Accordingly, the sealing resin 70 extends outward, in the x2 direction, of the input terminals 31 and 32 when viewed in the y direction, as shown in FIG. 20.

The cutout portion 741 is a portion recessed from the resin side face 731 in a plan view. The cutout portion 741 exposes a portion (terminal portion 332) of the output terminal 33 from the sealing resin 70. As shown in FIG. 18, the cutout portion 741 is arranged near the center in the y direction of the resin side face 731 in a plan view. The cutout portion 742 is a portion recessed from the resin side face 732 in a plan view. The cutout portion 742 exposes a portion (terminal portion 312) of the input terminal 31, a portion (terminal portion 322) of the input terminal 32, and a portion of the insulating material 39 (a portion of the extending portion 392) from the sealing resin 70. As shown in FIG. 18, the cutout portion 742 is arranged near the center in the y direction of the resin side face 732 in a plan view.

As shown in FIG. 19, the plurality of mounting holes 75 extend through the sealing resin 70 in the z direction from the resin obverse face 71 to the resin reverse face 72. The plurality of mounting holes 75 are used to attach the semiconductor device A2 to a heat sink (not shown). Each mounting hole 75 has a circular shape in a plan view. As shown in FIG. 18, the mounting holes 75 are located at four corners of the sealing resin 70 in a plan view.

According to the semiconductor device A2, the first blocks 61 (conductive blocks 60) and the lead members 40 are provided. The first blocks 61 are bonded to the semiconductor elements 10A via the block bonding materials 610. The thermal expansion coefficient of the first blocks 61 is smaller than the thermal expansion coefficient of the lead members 40. The lead members 40 are bonded to the first blocks 61 by laser welding, and are electrically connected to the semiconductor elements 10A via the first blocks 61. Each first block 61 and the corresponding lead member 40 are bonded to each other by the weld portion M4 at which a portion of the first block 61 and a portion of the lead member 40 are welded to each other. Accordingly, in the semiconductor device A2, thermal stress applied to the block bonding materials 610 can be mitigated, similarly to the semiconductor device A1. With this configuration, in the semiconductor device A2, fatigue failure and peeling of the block bonding materials 610 can be suppressed, and thus, the thermal cycle resistance can be improved.

According to the semiconductor device A2, the second blocks 62 (conductive blocks 60) and the input terminal 32 are provided. The second blocks 62 are bonded to the semiconductor elements 10B via the block bonding materials 620. The thermal expansion coefficient of the second blocks 62 is smaller than the thermal expansion coefficient of the input terminal 32. The input terminal 32 includes the extending portions 321b. The extending portions 321b are bonded to the second blocks 62 by laser welding, and are electrically connected to the semiconductor elements 10B via the second blocks 62. Each second block 62 and the corresponding extending portion 321b are bonded to each other by the weld portions M2 at which a portion of the second block 62 and a portion of the extending portion 321b are welded to each other. Accordingly, in the semiconductor device A2, thermal stress applied to the block bonding materials 620 can be mitigated, similarly to the semiconductor device A1. With this configuration, in the semiconductor device A2, fatigue failure and peeling of the block bonding materials 620 can be suppressed, and thus, the thermal cycle resistance can be improved.

In addition, according to the semiconductor device A2, the same effects as those of the semiconductor device A1 can be obtained by the same configurations as, or configurations similar to, those of the semiconductor device A1.

Figure 21:
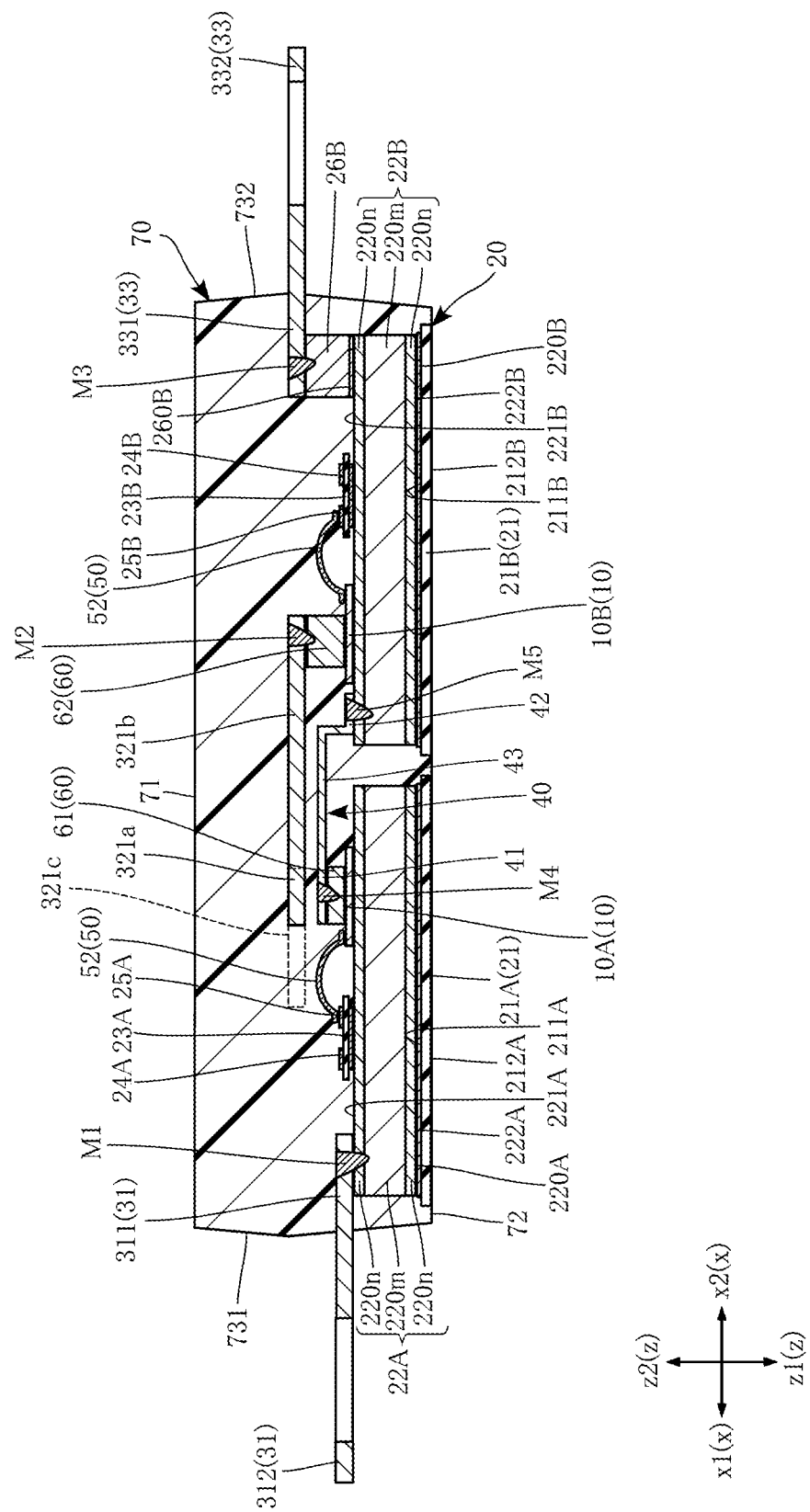
FIG. 21 is a cross-sectional view showing a semiconductor device according to a variation.
Figure 22:
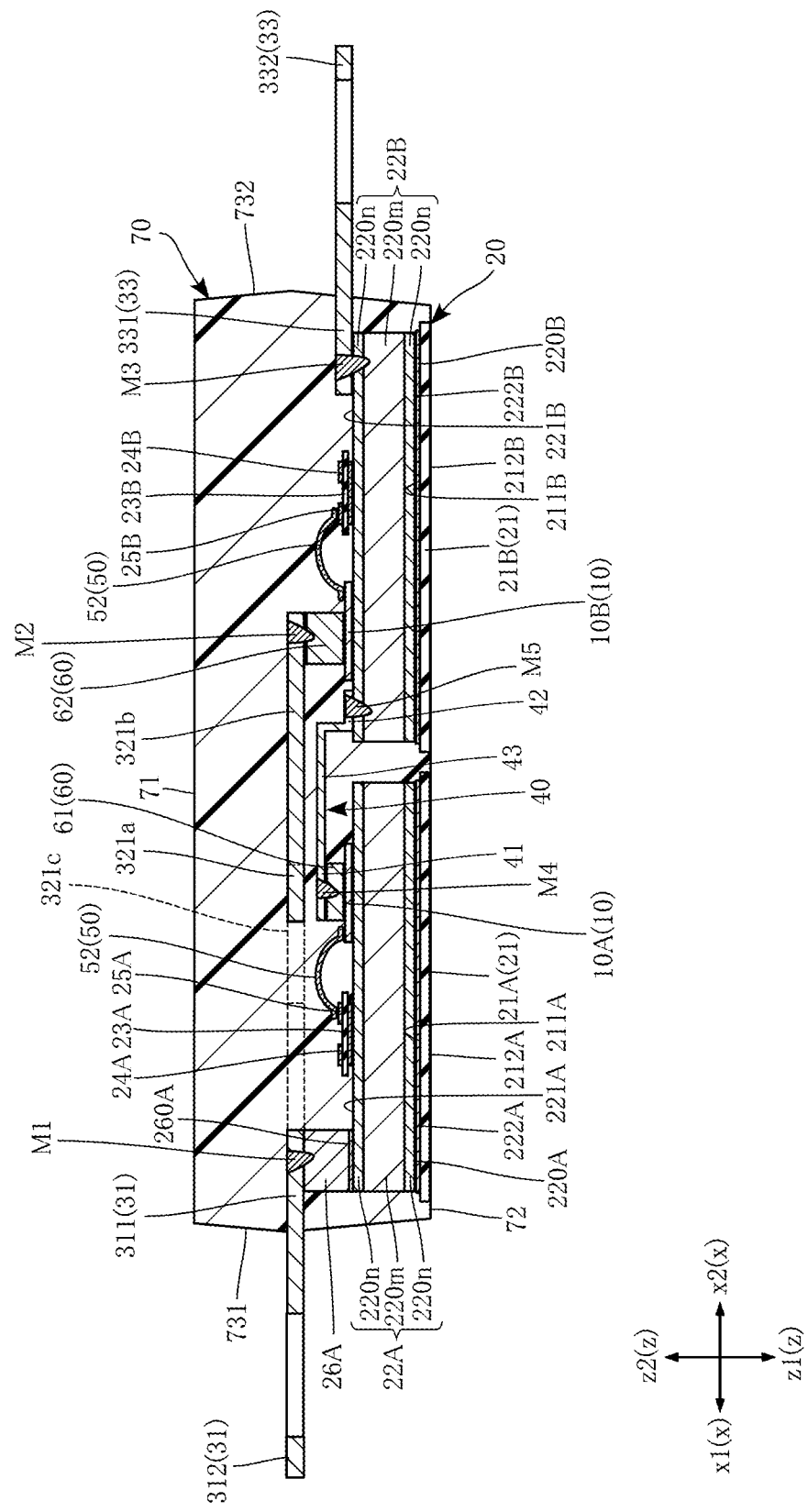
FIG. 22 is a cross-sectional view showing a semiconductor device according to a variation.
Figure 23:
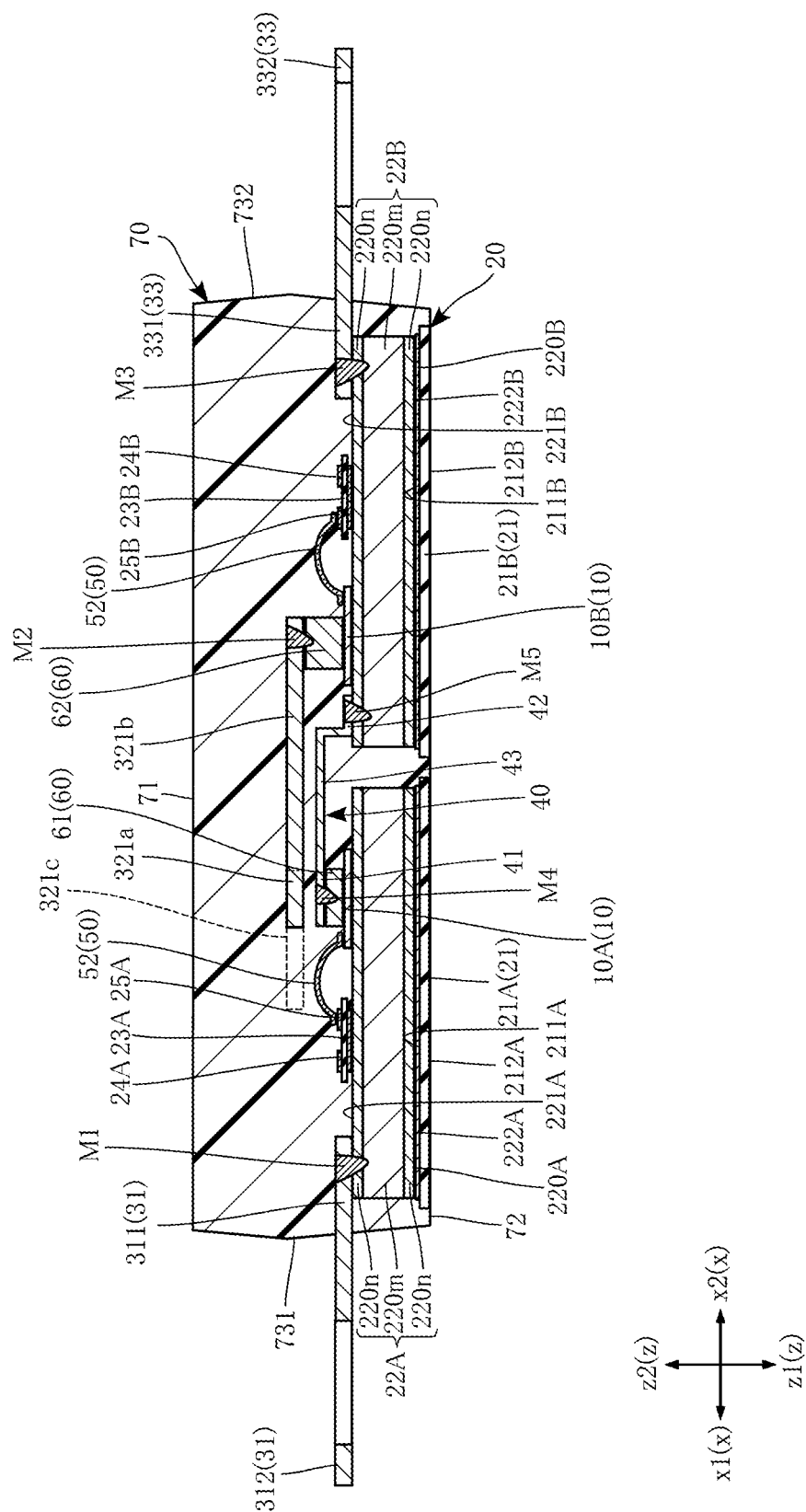
FIG. 23 is a cross-sectional view showing a semiconductor device according to a variation.

Although the first and second embodiments have described the case where the semiconductor devices A1 and A2 have the spacers 26A and 26B, the present invention is not limited thereto. For example, the semiconductor devices A1 and A2 may alternatively have a configuration in which the spacer 26A is not provided, and the input terminal 31 is directly bonded to the conductive substrate 22A. FIG. 21 shows the case where the semiconductor device A1 does not have the spacer 26A. FIG. 21 is a cross-sectional view corresponding to FIG. 10. In a mode shown in FIG. 21, a weld portion M1 is a portion at which a portion of the pad portion 311 (input terminal 31) and a portion of the conductive substrate 22A are welded to each other. Alternatively, the semiconductor devices A1 and A2 may have a configuration in which the spacer 26B is not provided, and the output terminal 33 is directly bonded to the conductive substrate 22B. FIG. 22 shows the case where the semiconductor device A1 does not have the spacer 26B. FIG. 22 is a cross-sectional view corresponding to FIG. 10. In a mode shown in FIG. 22, a weld portion M3 is a portion at which a portion of the pad portion 331 (output terminal 33) and a portion of the conductive substrate 22B are welded to each other. Furthermore, the semiconductor devices A1 and A2 may alternatively have a configuration in which the spacers 26A and 26B are not provided, the input terminal 31 is directly bonded to the conductive substrate 22A, and the output terminal 33 is directly bonded to the conductive substrate 22B. FIG. 23 shows the case where the semiconductor device A1 does not have the spacers 26A and 26B. FIG. 23 is a cross-sectional view corresponding to FIG. 10. In FIG. 23, the weld portion M1 is in the same mode as that shown in FIG. 21, and the weld portion M3 is in the same mode as that shown in FIG. 22. Note that the semiconductor device A2 may also be modified similarly.

Figure 24:
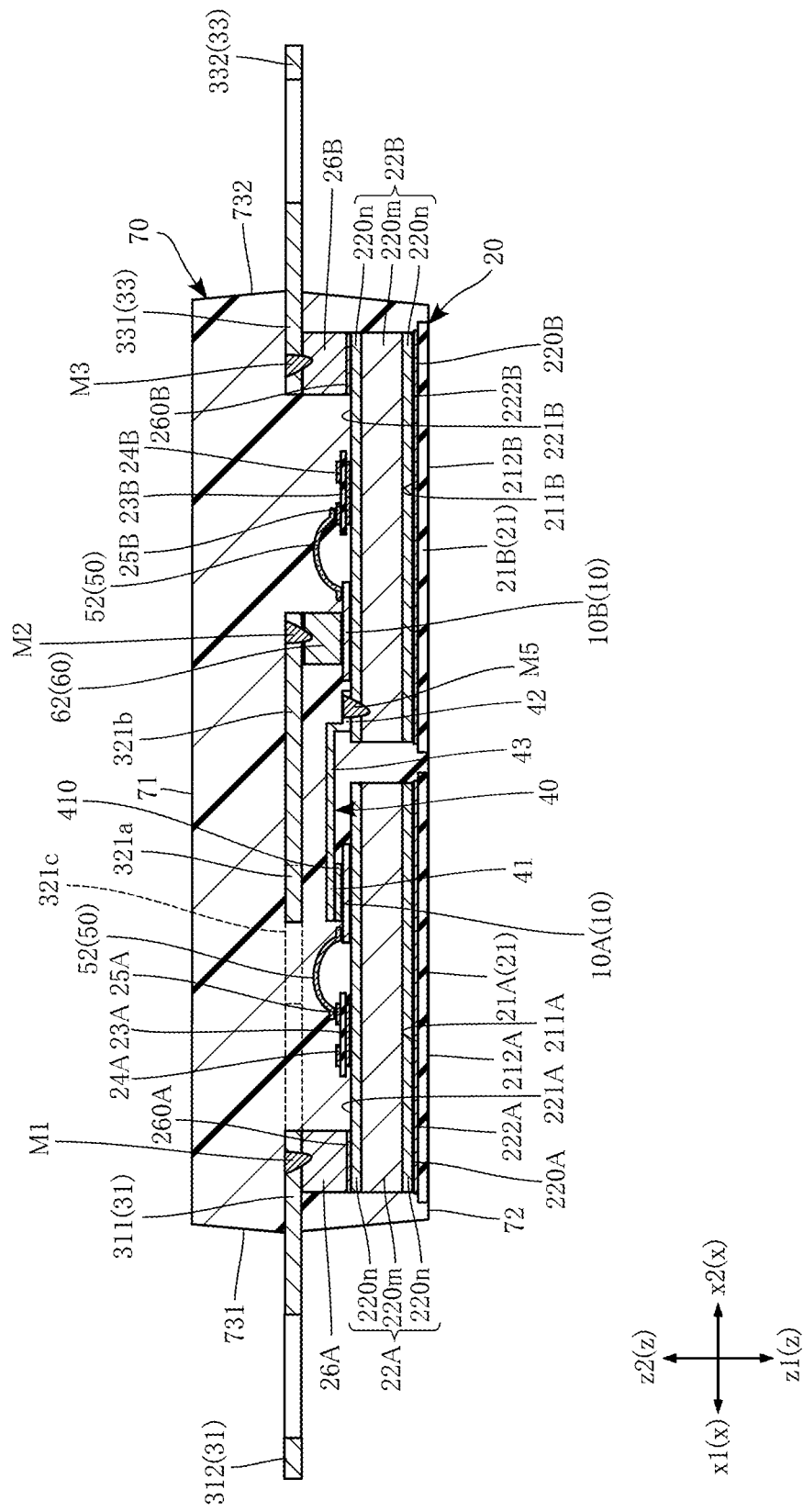
FIG. 24 is a cross-sectional view showing a semiconductor device according to a variation.
Figure 25:
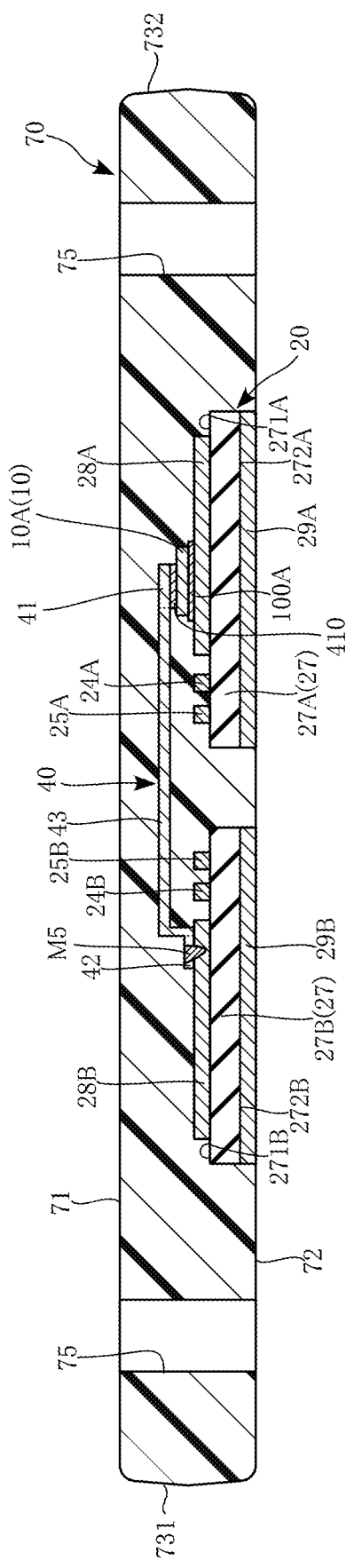
FIG. 25 is a cross-sectional view showing a semiconductor device according to a variation.
Figure 26:
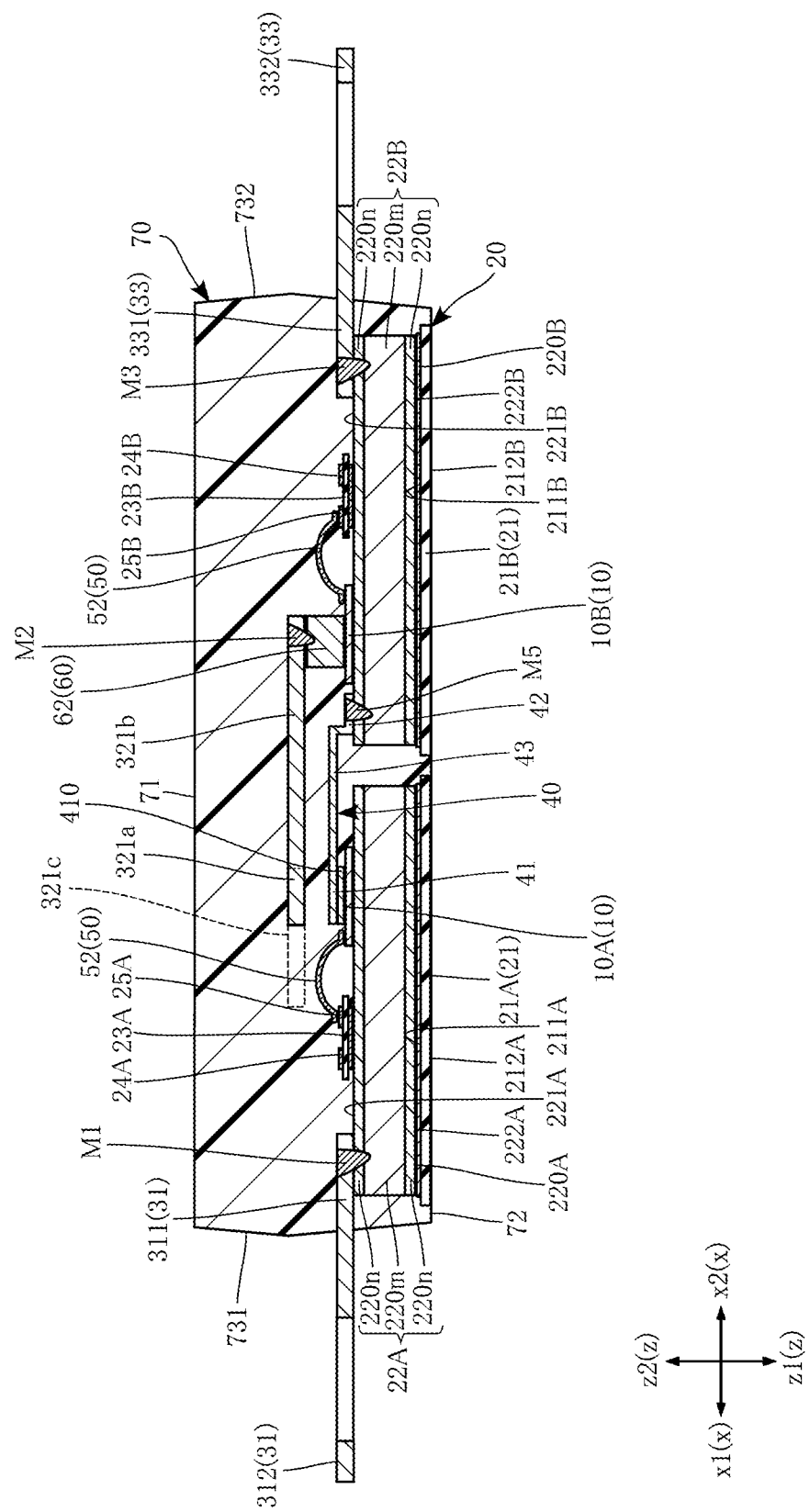
FIG. 26 is a cross-sectional view showing a semiconductor device according to a variation.

Although the first and second embodiments have described the case where the plurality of conductive blocks 60 include the plurality of first blocks 61, the present invention is not limited thereto, and the plurality of conductive blocks 60 do not need to include the plurality of first blocks 61. That is to say, a configuration may be employed in which the plurality of conductive blocks 60 do not include the plurality of first blocks 61, but include the plurality of second blocks 62. FIGS. 24 and 25 show the case where, in the semiconductor devices A1 and A2, the plurality of conductive blocks 60 do not include the plurality of first blocks 61. FIG. 24 corresponds to the cross-sectional view shown in FIG. 10, and FIG. 25 shows the cross-sectional view shown in FIG. 19. In this case, the first bonding portion 41 of each lead member 40 is bonded to the corresponding semiconductor element 10A via a conductive bonding material 410, as shown in FIGS. 24 and 25. The component material of the conductive bonding material 410 is, for example, solder or sintered metal. Note that, to bond each first bonding portion 41 to the corresponding semiconductor element 10A, in each lead member 40, a portion of the first bonding portion 41 or the connecting portion 43 may be bent in the z direction, or the length in the z direction of the first bonding portion 41 may be increased, or the connecting portion 43 may be less bent in the z direction on the side continuous with the second bonding portion 42. Both modes in FIGS. 24 and 25 show the case where the connecting portion 43 is less bent on the side continuous with the second bonding portion 42. Furthermore, to mitigate the thermal stress applied to the conductive bonding material 410, it is preferable that the component material of the lead members 40 has a thermal expansion coefficient of about 0 to 10 ppm/° C. Such materials include alloys such as Inver, Super-Inver, Kovar, or a CuMo sintered compact. In this variation, fatigue failure and peeling of the block bonding material 620 can be suppressed. Note that, in this variation as well, one of or both the spacers 26A and 26B do not need to be provided, as mentioned above. FIG. 26 shows the case where the spacers 26A and 26B are not provided in the mode shown in FIG. 24. FIG. 26 is a cross-sectional view corresponding to FIG. 24.

Although the first and second embodiments have described the case where the plurality of conductive blocks 60 include the plurality of second blocks 62, the present invention is not limited thereto, and the plurality of conductive blocks 60 do not need to include the plurality of second blocks 62. That is to say, a configuration may be employed in which the plurality of conductive blocks 60 include the plurality of first blocks 61, and do not include the plurality of second blocks 62. In this case, the extending portions 321b of the input terminal 32 are bonded to the semiconductor elements 10B via conductive bonding materials. The component material of these conductive bonding materials is, for example, solder or sintered metal. Note that, to bond each extending portions 321b to the corresponding semiconductor element 10B, a portion of the extending portion 321b may be bent in the z direction, or the length in the z direction of a portion thereof that overlaps with the semiconductor element 10B in a plan view may be increased. In this variation, fatigue failure and peeling of the block bonding material 610 can be suppressed. Note that, in this variation as well, one of or both the spacers 26A and 26B do not need to be provided, as mentioned above.

Although the first and second embodiments have described the case where a plurality of semiconductor elements 10A and 10B are provided, both the number of semiconductor elements 10A and the number of semiconductor elements 10B may be one. Although the case has been described where the plurality of semiconductor elements 10 include the semiconductor elements 10A and the semiconductor elements 10B, the plurality of semiconductor elements 10 may alternatively include either the semiconductor elements 10A or the semiconductor elements 10B.

The semiconductor device according to the present disclosure is not limited to the above-described embodiments. Specific configurations of each part of the semiconductor device of the present disclosure can be designed and modified in various manners.

The semiconductor device according to the present disclosure includes embodiments related to the following Appendixes.

APPENDIX 1

A semiconductor device including:
a semiconductor element having an element obverse face and an element reverse face facing toward opposite sides in a first direction;
a support substrate that supports the semiconductor element;
a conductive block bonded to the element obverse face via a first conductive bonding material; and
a metal member that is electrically connected to the semiconductor element via the conductive block,
wherein the conductive block has a thermal expansion coefficient smaller than a thermal expansion coefficient of the metal member, and
the conductive block and the metal member are bonded to each other by a weld portion at which a portion of the conductive block and a portion of the metal member are welded to each other.

APPENDIX 2

The semiconductor device described in Appendix 1,
wherein the conductive block contains an alloy that is one of Inver, Kobar, or a CuMo sintered compact.

APPENDIX 3

The semiconductor device described in Appendix 2,
wherein the conductive block has a first layer containing the alloy, and a pair of second layers containing a different metal from the first layer, and
the first layer is sandwiched by the two second layers in the first direction.

APPENDIX 4

The semiconductor device described in Appendix 3,
wherein the second layer contains copper.

APPENDIX 5

The semiconductor device described in Appendix 3 or 4,
wherein, in the first direction, an end portion of the weld portion on a side in a direction in which the element reverse face faces reaches the first layer.

APPENDIX 6

The semiconductor device described in any of Appendixes 1 to 5,
wherein the weld portion has an uneven surface facing in the same direction as the element obverse face.

APPENDIX 7

The semiconductor device described in any of Appendixes 1 to 6,
wherein the metal member is a lead member,
the conductive block includes a first block arranged on the semiconductor element,
the weld portion includes a first weld portion at which a portion of the lead member and a portion of the first block are welded to each other, and
the support substrate includes a first conductor that is electrically connected to the semiconductor element via a second conductive bonding material, and a second conductor that is electrically connected to the semiconductor element via the lead member.

APPENDIX 8

The semiconductor device described in Appendix 7,
wherein the lead member is bonded to the second conductor, and
a portion of the lead member and a portion of the second conductor are bonded to each other by a second weld portion at which the portion of the lead member and the portion of the second conductor are welded to each other.

APPENDIX 9

The semiconductor device described in Appendix 7 or 8,
wherein the support substrate includes an insulating substrate to which the first conductor and the second conductor are bonded.

APPENDIX 10

The semiconductor device described in any of Appendixes 7 to 9,
wherein the first conductor and the second conductor are composite substrates in each of which a copper film is formed on a graphite substrate.

APPENDIX 11

The semiconductor device described in any of Appendixes 7 to 10,
wherein, assuming that the semiconductor element is a first semiconductor element, the semiconductor device further includes a second semiconductor element that differs from the first semiconductor element, and
the second semiconductor element is bonded to the second conductor.

APPENDIX 12

The semiconductor device described in Appendix 11, further including:
a first terminal that is conductively bonded to the first conductor;
a second terminal that is conductively bonded to the second semiconductor element; and
a third terminal that is conductively bonded to the second conductor.

APPENDIX 13

The semiconductor device described in Appendix 12,
wherein the conductive block further includes a second block arranged on the second semiconductor element, and
the second terminal is electrically connected to the second semiconductor element via the second block.

APPENDIX 14

The semiconductor device described in Appendix 13,
wherein a length in the first direction of the first block is smaller than a length in the first direction of the second block.

APPENDIX 15

The semiconductor device described in Appendix 14,
wherein the second terminal includes an extending portion that extends from the first conductor to the second conductor when viewed in the first direction, and
the extending portion is partially bonded to the second semiconductor element via the second block, and overlaps with the lead member when viewed in the first direction.

APPENDIX 16

The semiconductor device described in any of Appendixes 12 to 15, further including
a first spacer and a second spacer that are conductive,
wherein the first spacer overlaps with a portion of the first terminal and a portion of the first conductor when viewed in the first direction, and is interposed between the first terminal and the first conductor in the first direction, and
the second spacer overlaps with a portion of the third terminal and a portion of the second conductor when viewed in the first direction, and is interposed between the third terminal and the second conductor in the first direction.

APPENDIX 17

The semiconductor device described in Appendix 16,
wherein the first terminal and the first spacer are bonded to each other by a third weld portion at which a portion of the first terminal and a portion of the first spacer are welded to each other, and
the third terminal and the second spacer are bonded to each other by a fourth weld portion at which a portion of the third terminal and a portion of the second spacer are welded to each other.

APPENDIX 18

The semiconductor device described in Appendix 16 or 17,
wherein the first spacer and the second spacer contain copper.

APPENDIX 19

The semiconductor device described in any of Appendixes 12 to 18, further including
a sealing resin that is electrically insulating,
wherein the sealing resin covers the first semiconductor element, the second semiconductor element, a portion of the first terminal, a portion of the second terminal, a portion of the third terminal, and a portion of the support substrate.

The invention claimed is:

1. A semiconductor device comprising:
a semiconductor element having an element obverse face and an element reverse face facing toward opposite sides in a first direction;
a support substrate that supports the semiconductor element;
a conductive block bonded to the element obverse face via a first conductive bonding material; and
a metal member that is electrically connected to the semiconductor element via the conductive block, wherein
the conductive block has a thermal expansion coefficient smaller than a thermal expansion coefficient of the metal member,
the conductive block and the metal member are bonded to each other by a weld portion at which a portion of the conductive block and a portion of the metal member are welded to each other,
the conductive block is disposed between the metal member and the semiconductor element in the first direction, and
the conductive block comprises:
a first layer, and
a pair of second layers,
the first layer containing an alloy having a thermal expansion coefficient that is smaller than the thermal expansion coefficient of the metal member,
each of the second layers containing a metal that is different from the first layer, and
the first layer being sandwiched by the second layers in the first direction.

2. The semiconductor device according to claim 1, wherein the first layer contains an alloy that is one of Inver, Kobar, or a CuMo sintered compact.

3. The semiconductor device according to claim 1, wherein each of the second layers contains copper.

4. The semiconductor device according to claim 1, wherein, in the first direction, an end portion of the weld portion on a side in a direction in which the element reverse face faces reaches the first layer.

5. The semiconductor device according to claim 1, wherein the weld portion has an uneven surface facing in a same direction as the element obverse face.

6. The semiconductor device according to claim 1, wherein
the metal member is a lead member,
the conductive block includes a first block disposed on the semiconductor element,
the weld portion includes a first weld portion at which a portion of the lead member and a portion of the first block are welded to each other, and
the support substrate includes a first conductor that is electrically connected to the semiconductor element via a second conductive bonding material, and a second conductor that is electrically connected to the semiconductor element via the lead member.

7. The semiconductor device according to claim 6, wherein
the lead member is bonded to the second conductor, and
a portion of the lead member and a portion of the second conductor are bonded to each other by a second weld portion at which the portion of the lead member and the portion of the second conductor are welded to each other.

8. The semiconductor device according to claim 6, wherein the support substrate includes an insulating substrate to which the first conductor and the second conductor are bonded.

9. The semiconductor device according to claim 6, wherein the first conductor and the second conductor are composite substrates each comprising a graphite substrate and a copper film formed on the graphite substrate.

10. The semiconductor device according to claim 6, wherein
the semiconductor element is referred to as a first semiconductor element,
the semiconductor device further comprising:
a second semiconductor element that differs from the first semiconductor element, and
the second semiconductor element is bonded to the second conductor.

11. The semiconductor device according to claim 10, further comprising:
a first terminal that is conductively bonded to the first conductor;
a second terminal that is conductively bonded to the second semiconductor element; and
a third terminal that is conductively bonded to the second conductor.

12. The semiconductor device according to claim 11, wherein
the conductive block further includes a second block disposed on the second semiconductor element, and
the second terminal is electrically connected to the second semiconductor element via the second block.

13. The semiconductor device according to claim 12, wherein a length in the first direction of the first block is smaller than a length in the first direction of the second block.

14. A semiconductor device, comprising:
a first semiconductor element having an element obverse face and an element reverse face facing toward opposite sides in a first direction;
a support substrate that supports the first semiconductor element;
a conductive block bonded to the element obverse face via a first conductive bonding material, and
a metal member that is electrically connected to the first semiconductor element via the conductive block,
wherein
the conductive block has a thermal expansion coefficient smaller than a thermal expansion coefficient of the metal member,
the conductive block and the metal member are bonded to each other by a weld portion at which a portion of the conductive block and a portion of the metal member are welded to each other,
the metal member is a lead member,
the conductive block comprises:
a first block disposed on the first semiconductor element,
the weld portion includes a first weld portion at which a portion of the lead member and a portion of the first block are welded to each other,
the support substrate comprises:
a first conductor that is electrically connected to the first semiconductor element via a second conductive bonding material, and
a second conductor that is electrically connected to the first semiconductor element via the lead member,
the semiconductor device comprises:
a second semiconductor element that differs from the first semiconductor element, the second semiconductor element being bonded to the second conductor,
a first terminal that is conductively bonded to the first conductor,
a second terminal that is conductively bonded to the second semiconductor element, and
a third terminal that is conductively bonded to the second conductor,
the conductive block further comprises:
a second block disposed on the second semiconductor element, the second terminal being electrically connected to the second semiconductor element via the second block,
a length in the first direction of the first block is smaller than a length in the first direction of the second block,
the second terminal includes an extending portion that extends from the first conductor to the second conductor when viewed in the first direction, and
the extending portion is partially bonded to the second semiconductor element via the second block, and overlaps with the lead member as viewed in the first direction.

15. The semiconductor device according to claim 11, further comprising a first spacer and a second spacer that are conductive, wherein
the first spacer overlaps with a portion of the first terminal and a portion of the first conductor as viewed in the first direction, and is interposed between the first terminal and the first conductor in the first direction, and
the second spacer overlaps with a portion of the third terminal and a portion of the second conductor as viewed in the first direction, and is interposed between the third terminal and the second conductor in the first direction.

16. The semiconductor device according to claim 15, wherein
the first terminal and the first spacer are bonded to each other by a third weld portion at which a portion of the first terminal and a portion of the first spacer are welded to each other, and
the third terminal and the second spacer are bonded to each other by a fourth weld portion at which a portion of the third terminal and a portion of the second spacer are welded to each other.

17. The semiconductor device according to claim 15, wherein the first spacer and the second spacer contain copper.

18. The semiconductor device according to claim 11, further comprising a sealing resin that is electrically insulating,
wherein the sealing resin covers the first semiconductor element, the second semiconductor element, a portion of the first terminal, a portion of the second terminal, a portion of the third terminal, and a portion of the support substrate.

19. A semiconductor device comprising:
a semiconductor element having an element obverse face and an element reverse face facing toward opposite sides in a first direction;
a support substrate that supports the semiconductor element;

a conductive block bonded to the element obverse face via a first conductive bonding material; and a metal member that is electrically connected to the semiconductor element via the conductive block, wherein the conductive block has a thermal expansion coefficient smaller than a thermal expansion coefficient of the metal member, the conductive block and the metal member are bonded to each other by a weld portion at which a portion of the conductive block and a portion of the metal member are welded to each other, the conductive block is disposed between the metal member and the semiconductor element in the first direction, the weld portion comprises a surface and an end portion, the surface facing to a same direction as the element obverse face in the first direction, the end portion being opposite to the surface in the first direction, and a line connecting a center of the surface and the end portion is tilted relative to the first direction.

* * * * *